(12) United States Patent
Sung et al.

(10) Patent No.: US 9,859,125 B2
(45) Date of Patent: Jan. 2, 2018

(54) BLOCK PATTERNING METHOD ENABLING MERGED SPACE IN SRAM WITH HETEROGENEOUS MANDREL

(71) Applicant: GLOBALFOUNDRIES Inc., Grand Cayman (KY)

(72) Inventors: Min Gyu Sung, Latham, NY (US); Ruilong Xie, Niskayuna, NY (US); Chanro Park, Clifton Park, NY (US); Hoon Kim, Clifton Park, NY (US); Kwan-Yong Lim, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/072,626

(22) Filed: Mar. 17, 2016

(65) Prior Publication Data

US 2017/0271163 A1    Sep. 21, 2017

(51) Int. Cl.
| | |
|---|---|
| *H01L 21/311* | (2006.01) |
| *H01L 21/3065* | (2006.01) |
| *H01L 21/308* | (2006.01) |
| *H01L 27/11* | (2006.01) |
| *H01L 29/06* | (2006.01) |
| *H01L 29/161* | (2006.01) |

(52) U.S. Cl.
CPC ...... *H01L 21/3065* (2013.01); *H01L 21/3085* (2013.01); *H01L 21/31111* (2013.01); *H01L 21/31144* (2013.01); *H01L 27/11* (2013.01); *H01L 29/0642* (2013.01); *H01L 29/0657* (2013.01); *H01L 29/161* (2013.01)

(58) Field of Classification Search
CPC ............. H01L 21/3065; H01L 21/3085; H01L 21/3111; H01L 21/31144
USPC .......................................................... 257/622
See application file for complete search history.

(56) References Cited

U.S. PATENT DOCUMENTS

| | | | |
|---|---|---|---|
| 2007/0049032 A1* | 3/2007 | Abatchev | H01L 21/0337 438/691 |
| 2011/0003469 A1* | 1/2011 | Kewley | H01L 21/0337 438/591 |
| 2014/0187047 A1* | 7/2014 | Tagami | H01L 21/0276 438/703 |
| 2014/0264717 A1* | 9/2014 | Shieh | H01L 29/06 257/499 |

* cited by examiner

*Primary Examiner* — Whitney T Moore
*Assistant Examiner* — Herve Assouman
(74) *Attorney, Agent, or Firm* — Ditthavong & Steiner, P.C.

(57) ABSTRACT

Methodologies and a device for SRAM patterning are provided. Embodiments include forming a spacer layer over a fin channel, the fin channel being formed in four different device regions; forming a bottom mandrel over the spacer layer; forming a top mandrel directly over the bottom mandrel, wherein the top and bottom mandrels including different materials; forming a buffer oxide layer over the top mandrel; forming an anti-reflective coating (ARC) over the first OPL; forming a photoresist (PR) over the ARC and patterning the PR; and etching the first OPL, ARC, buffer oxide, and top mandrel with the pattern of the PR, wherein a pitch of the PR as patterned is different in each of the four device regions.

17 Claims, 31 Drawing Sheets

BLOCK PATTERNING METHOD ENABLING MERGED SPACE IN SRAM WITH HETEROGENEOUS MANDREL

TECHNICAL FIELD

The present disclosure relates to lithography of semiconductor devices including static random-access memory (SRAM) devices. In particular, the present disclosure relates to a block patterning technique for semiconductor devices in the 10 nanometer (nm) technology node and beyond.

BACKGROUND

Reactive ion etching (RIE) is used to produce fin channels. However, punch-through errors can occur with conventional processing. With existing technology, both a top mandrel and bottom mandrel are formed of the same material (i.e. a homogenous mandrel). During RIE, punch-through of the bottom of the silicon nitride (SiN) hardmask (HM) occurs at an open area. Further, during removal of the bottom mandrel, punch-through of the Si substrate at an open area occurs. These punch-through errors adversely impact device processing including a runpath only being available using select marks, and defects downstream can go undetected. With other conventional processing of fin channels, a heterogeneous mandrel can be used where the top and bottom mandrels are made of different materials. However, when the top mandrel is an organic planarizing layer (OPL), OPL cannot be utilized for the lithography for the block patterning.

A need therefore exists for methodology that uses a unique block patterning scheme enabling the merging of space in SRAM devices using a heterogenous mandrel without generating punch-through errors.

SUMMARY

An aspect of the present disclosure is a unique block patterning scheme enabling the merging of space in SRAM devices using a heterogenous mandrel and preventing punch-through errors.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a spacer layer over a fin channel, the fin channel being formed in four different device regions; forming a bottom mandrel over the spacer layer; forming a top mandrel directly over the bottom mandrel, wherein the top and bottom mandrels include different materials; forming a buffer oxide layer over the top mandrel; forming an anti-reflective coating (ARC) over the first OPL; forming a photoresist (PR) over the ARC and patterning the PR; and etching the first OPL, ARC, buffer oxide, and top mandrel with the pattern of the PR, wherein a pitch of the PR as patterned is different in each of the four device regions.

Aspects of the present disclosure include the bottom mandrel including amorphous silicon (a-Si), the top mandrel including amorphous carbon (aC), and the buffer oxide layer including silicon dioxide ($SiO_2$). Other aspects include the fin channel including silicon germanium (SiGe), and the spacer layer including SiN. Another aspect includes etching the ARC and OPL using the PR as a mask; removing the PR; etching the buffer oxide layer; removing the ARC; etching the top mandrel using the OPL and buffer oxide as a mask; and removing the OPL and buffer oxide. Further aspects include etching through the top mandrel down to the bottom mandrel using the buffer oxide layer as a mask to form a patterned top mandrel in each of the four device regions; and removing the buffer oxide layer, wherein a pitch of the patterned top mandrel is different in each of the four device regions. Still further aspects include forming a first spacer oxide layer over the top mandrel; forming and planarizing a second OPL over the first spacer oxide layer; forming a second ARC over the second OPL; forming a second PR over the second ARC in a portion of a first device region; removing the ARC and OPL from the second, third, and fourth device regions; removing the PR and ARC from the first device region; forming a second spacer oxide layer over all four device regions; etching back the second spacer oxide layer; and removing the second OPL in the first device region. Additional aspects include forming a third OPL and third ARC over the first spacer oxide layer; forming a third PR in a portion of the second device region and in the third and fourth device regions; and removing the third ARC and the third OPL in the first device region and a portion of the second device region; and removing the third PR and remaining third ARC. Yet further aspects include removing horizontal portions of the first spacer oxide layer in the first device region; and removing the top mandrel in the first device region and the third OPL in the second third and fourth device regions, wherein the third OPL and top mandrel are formed of the same material. Additional aspects include forming and planarizing a fourth OPL over the first spacer oxide layer; forming a fourth ARC over the fourth OPL; forming a fourth PR in a portion of the fourth device region and in the first and second device regions; removing the fourth ARC and the fourth OPL in the third device region and a portion of the fourth device region; and removing remaining fourth PR and fourth ARC. Still further aspects include forming a second spacer oxide layer in each of the four device regions; removing horizontal portions of the second spacer oxide layer; and removing remaining fourth OPL in the first, second and third device regions and removing the top mandrel in the third device region, wherein the fourth OPL and top mandrel are formed of the same material. Other aspects include performing a spacer oxide etch back to remove the second spacer oxide layer from an upper surface of the top mandrel in the second and fourth device regions; removing the top mandrel in the second and fourth regions, wherein a pitch of remaining spacer oxide is different in each of the four device regions. Aspects also include etching the bottom mandrel down to the bottom spacer formed over the fin channel using the remaining spacer oxide as a mask; removing the spacer oxide; and forming a conformal spacer oxide layer over the bottom mandrel and upper surface of the bottom spacer. Other aspects include removing horizontal portions of the conformal spacer oxide layer; and removing the bottom mandrel, wherein a pitch of remaining conformal spacer oxide layer is different in each of the four device regions. Yet further aspects include etching the bottom spacer down to a pad oxide layer formed over the fin channel using remaining conformal spacer oxide layer as a mask. Other aspects include etching the fin channel through the pad oxide layer to form fins in each of the four device regions, wherein a pitch of the fins in each of the four device areas is different; and removing the remaining conformal spacer oxide layer.

Still further aspects include etching the fin channel with RIE; and removing the conformal spacer oxide layer with buffered hydrofluoric acid (BHF).

Another aspect of the present disclosure is a device including a substrate; and four device regions formed over the substrate, wherein the device is formed by: forming a spacer layer over a fin channel, the fin channel being formed in each of the four device regions; forming a bottom mandrel over the spacer layer; forming a top mandrel directly over the bottom mandrel, wherein the top and bottom mandrels include different materials; forming a buffer oxide layer over the top mandrel; forming an OPL over the buffer oxide layer; forming an ARC over the first OPL; forming a PR over the ARC and patterning the PR; and etching the first OPL, ARC, buffer oxide, and top mandrel with the pattern of the PR, wherein a pitch of the PR as patterned is different in each of the four device regions.

Aspects include the four device regions including an EG device, SG device, static SRAM 111 device and SRAM 122 device. Other aspects include the fins including SiGe.

Yet another aspect of the present disclosure includes forming a pad oxide layer over a SiGe fin channel formed in four different device regions; forming a SiN spacer layer over the pad oxide; forming bottom mandrel including a-Si over the SiN spacer layer; forming a top mandrel including aC directly on the bottom mandrel; forming a buffer oxide layer including silicon dioxide over the top mandrel; forming an OPL including aC over the buffer oxide layer; forming an ARC over the first OPL; forming and patterning a PR layer over the ARC, wherein a pitch of the PR as patterned is different in each of the four device regions; etching the ARC, OPL, buffer oxide, and top mandrel using the pattern of the PR; and removing the PR, OPL, and buffer oxide.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of punch-through errors during patterning of fins in semiconductor devices. Methodology in accordance with embodiments of the present disclosure includes forming a spacer layer over a fin channel, the fin channel being formed in four different device regions; forming a bottom mandrel over the spacer layer; forming a top mandrel directly over the bottom mandrel, wherein the top and bottom mandrels include different materials; forming a buffer oxide layer over the top mandrel; forming an ARC over the first OPL; forming a PR over the ARC and patterning the PR; and etching the first OPL, ARC, buffer oxide, and top mandrel with the pattern of the PR, wherein a pitch of the PR as patterned is different in each of the four device regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
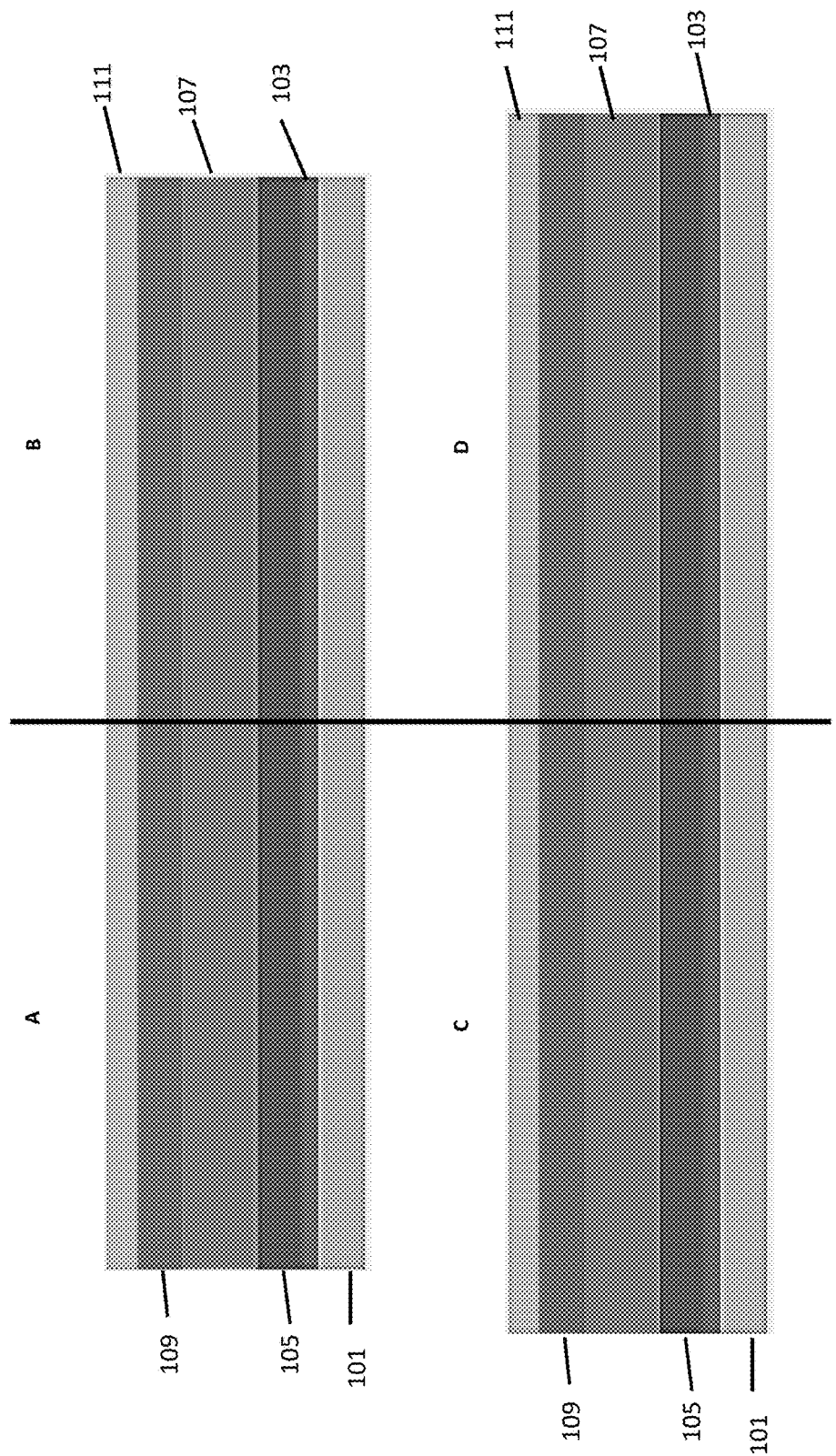
FIGS. 1-31 schematically illustrates a block patterning process flow for generating fins, in accordance with an exemplary embodiment.

Adverting to FIG. 1, a fin channel 101 is formed over a substrate (not shown for illustrative convenience) in each of device regions A, B, C and D. Each of device regions A, B, C and D are patterned at the same time. The fin channel 101 is formed of a silicon material such as SiGe to a thickness of 25 to 45 nanometers (nm). A pad oxide 103 is deposited over the fin channel 101. A spacer layer 105 is formed over the pad oxide 103. The spacer layer 105 serves as a RIE etch stop layer and is formed of SiN to a thickness of 20 to 40 nm. A bottom mandrel 107 is formed over the spacer layer 105, and a top mandrel 109 is formed directly over the bottom mandrel 107. The bottom and top mandrels 107 and 109 are made of different materials (i.e. heterogenous). The bottom mandrel is formed of a-Si to a thickness of 40 to 60 nm, and the top mandrel is formed of aC to a thickness of 20 to 40 nm. A buffer oxide layer 111 is formed over the top mandrel 109 and is formed of $SiO_2$ to a thickness of 10 to 30 nm.

Figure 2:
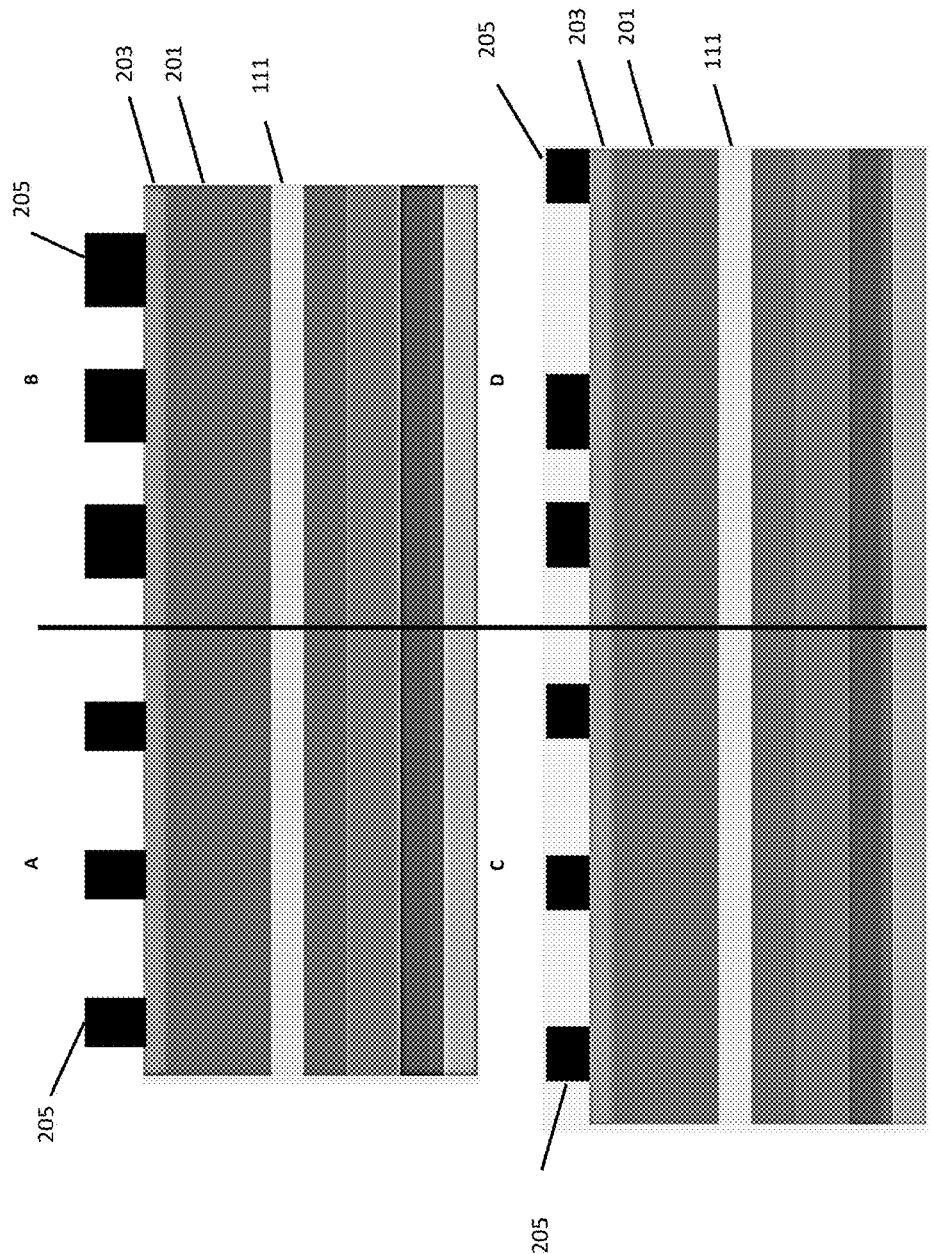

Adverting to FIG. 2, a first OPL 201 is formed over the buffer oxide layer 111, and an ARC 203 is formed over the first OPL 201. The first OPL is formed to a thickness of 200 to 400 nm and the ARC 203 is formed of a silicon-containing anti-reflective coating (SiARC) to a thickness of 15 to 45 nm. A PR 205 is deposited over the ARC 203, and the PR 205 is patterned. A pitch of the PR 205, as patterned, is different in each of the four device regions A, B, C and D. The pitch of the patterned PR 205 is the center-to-center distance between patterned features of the PR 205.

Figure 3:
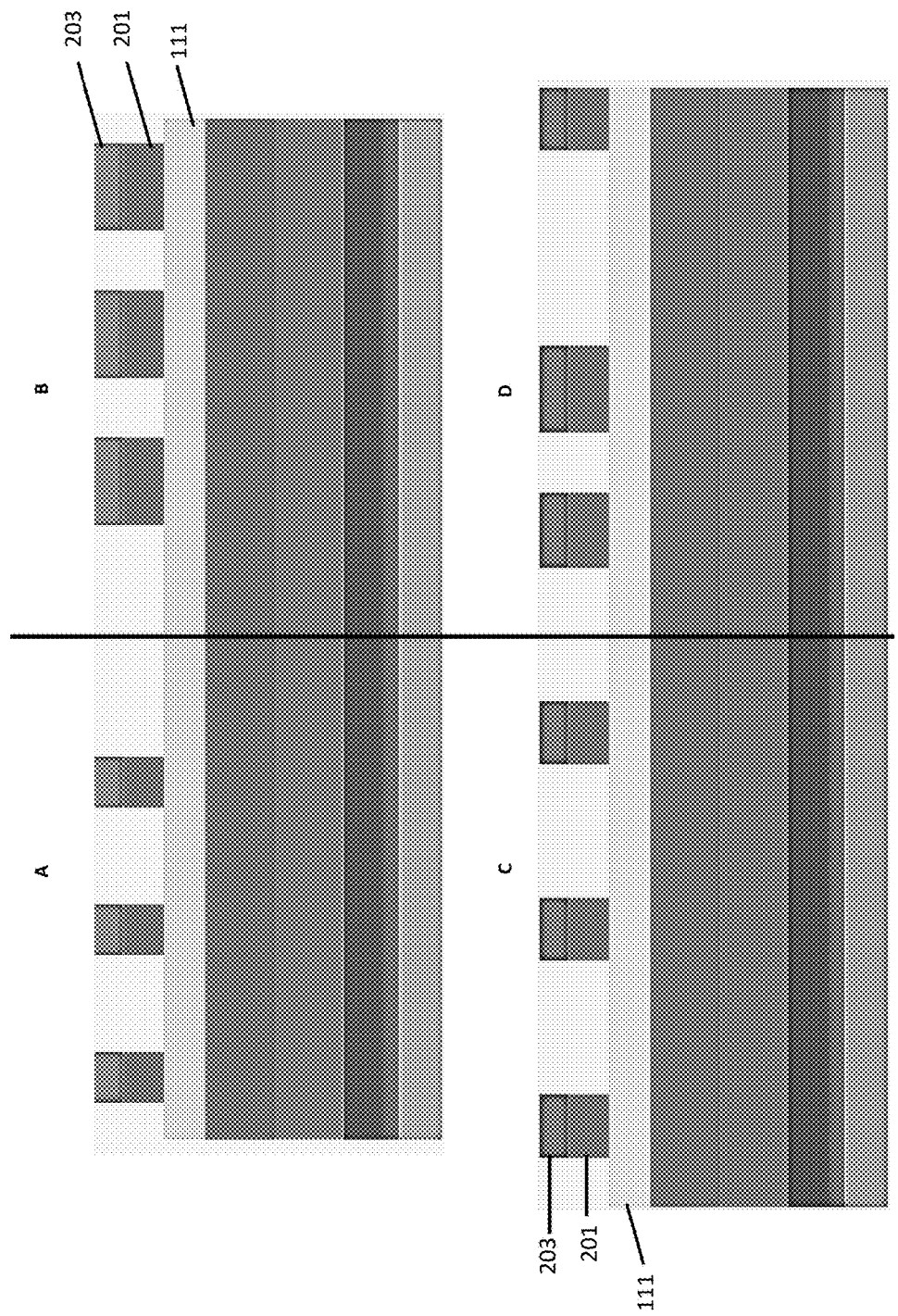
Figure 4:
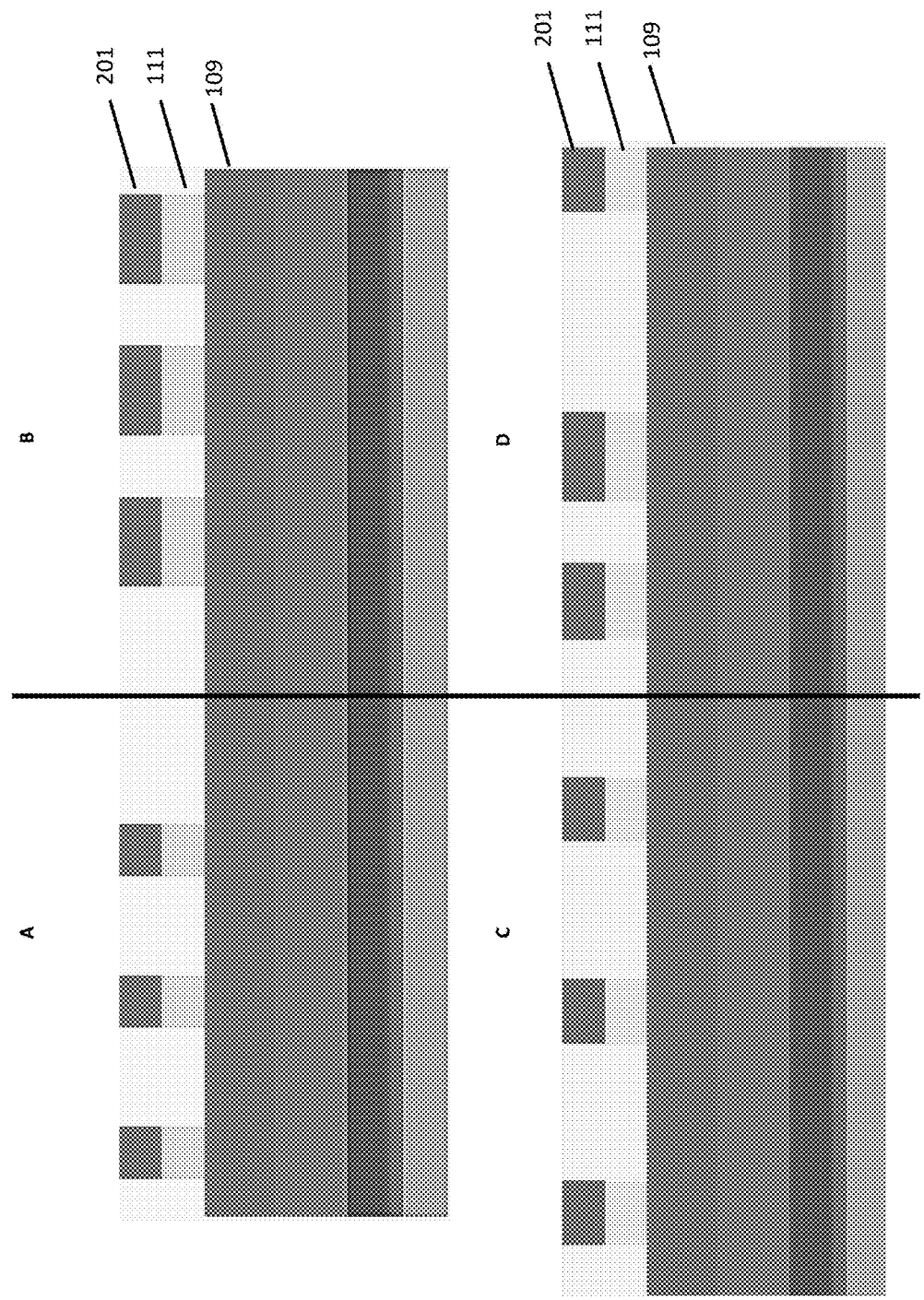
Figure 5:
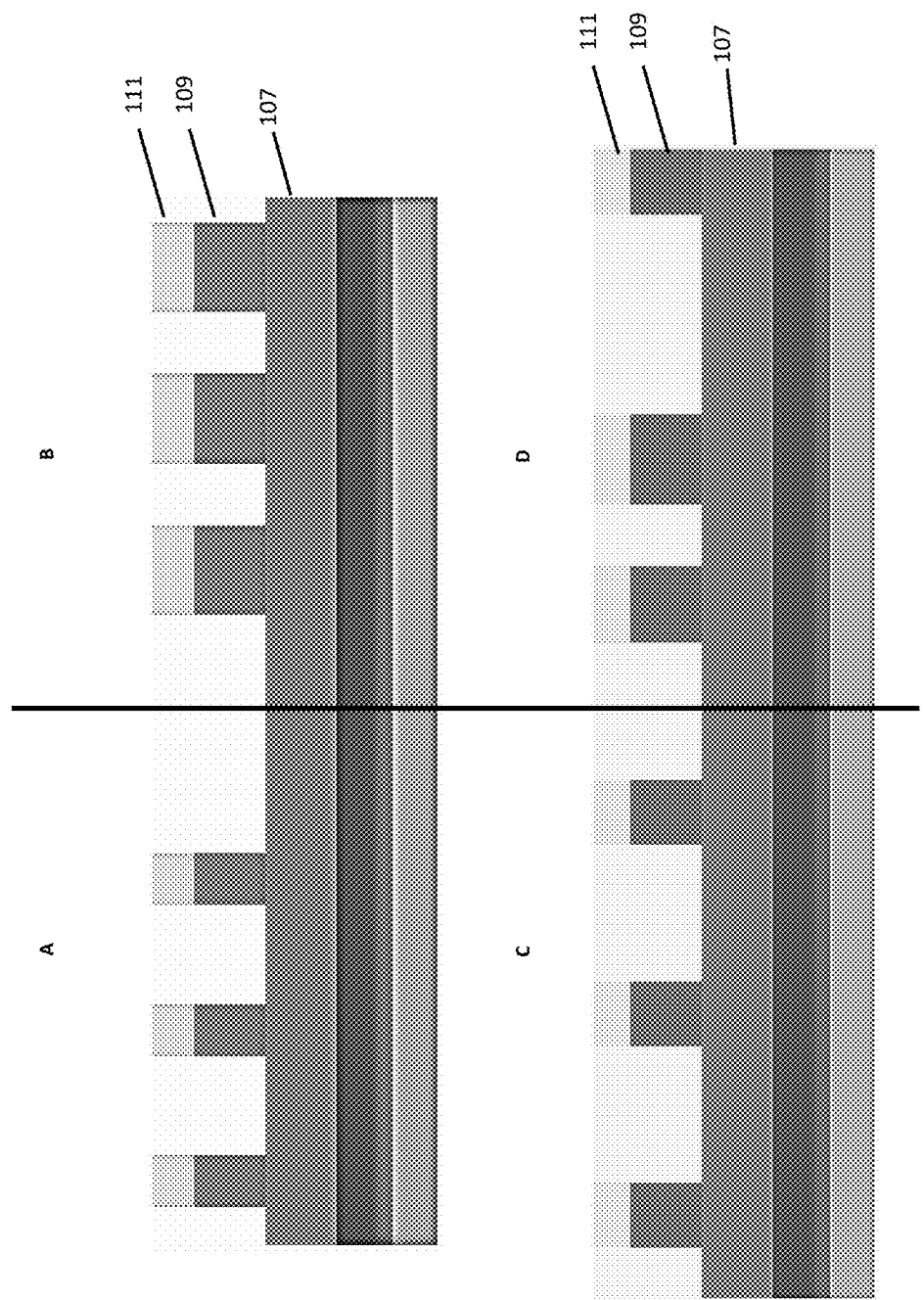
Figure 6:
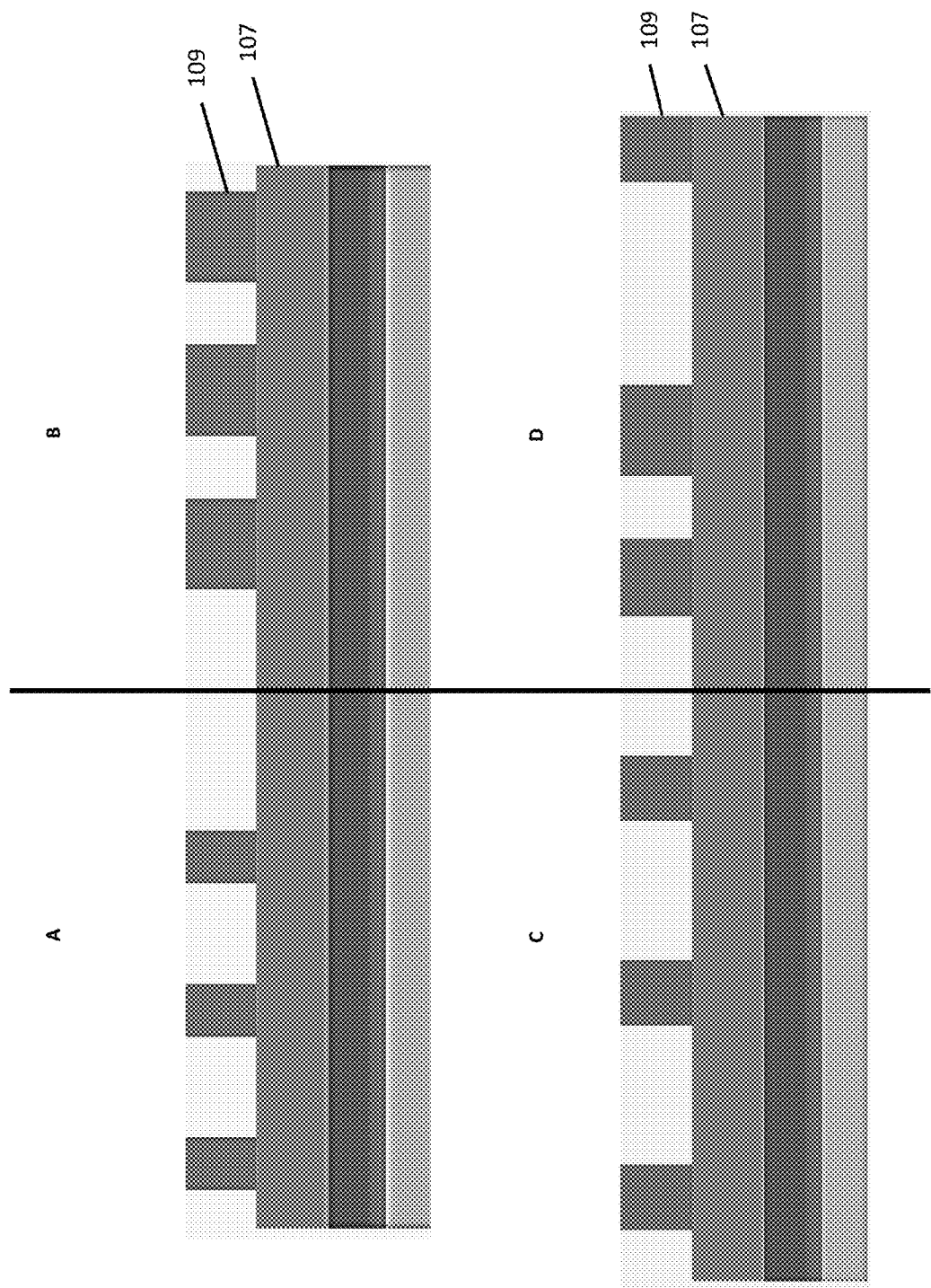

Adverting to FIG. 3, the first OPL 201 and ARC 203 are etched with RIE with the pattern of the PR 205. An upper surface of the buffer oxide 111 is exposed between the patterned stack of the first OPL 201 and ARC 203. In FIG. 3, the PR 205 is shown removed after the etching step. Adverting to FIG. 4, the buffer oxide layer 111 is etched down to the upper surface of the top mandrel 109. The ARC 203 is subsequently removed. The first OPL 201 and the top mandrel 109 are formed of the same material. Adverting to FIG. 5, the top mandrel 109 is etched with RIE down to an upper surface of the bottom mandrel 107. Adverting to FIG. 6, the buffer oxide layer 111 is removed leaving a patterned top mandrel 109. The pitch of the patterned top mandrel 109 is the same as the patterned PR layer 205 (FIG. 2)

Figure 7:
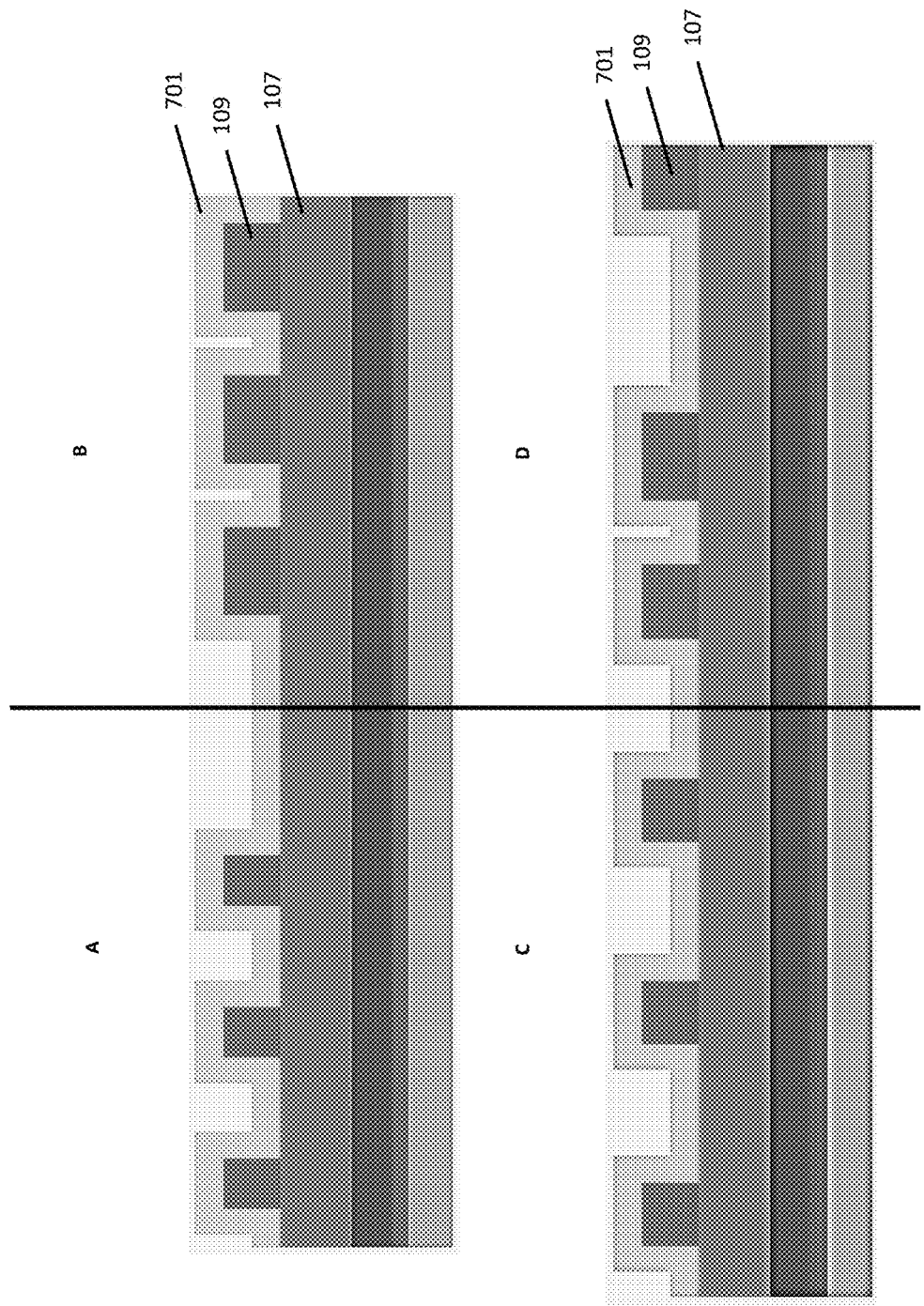

Adverting to FIG. 7, a first spacer oxide layer 701 is conformal deposited over the top mandrel 109. Upper and side surfaces of the patterned top mandrel 109 are covered by the spacer oxide as well as the upper surface of the bottom mandrel 107 exposed between the patterned top mandrel 109.

Figure 8:
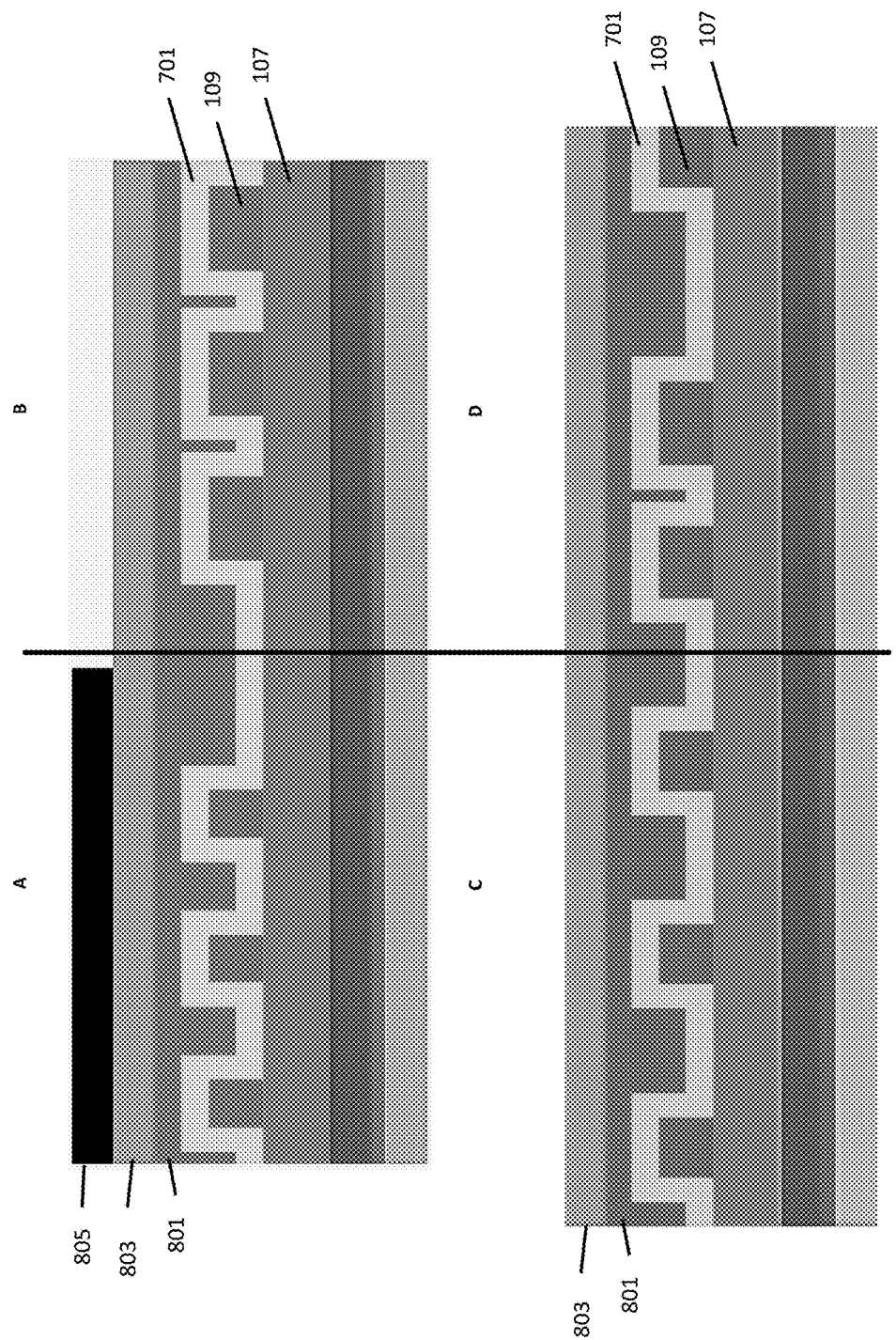
Figure 9:
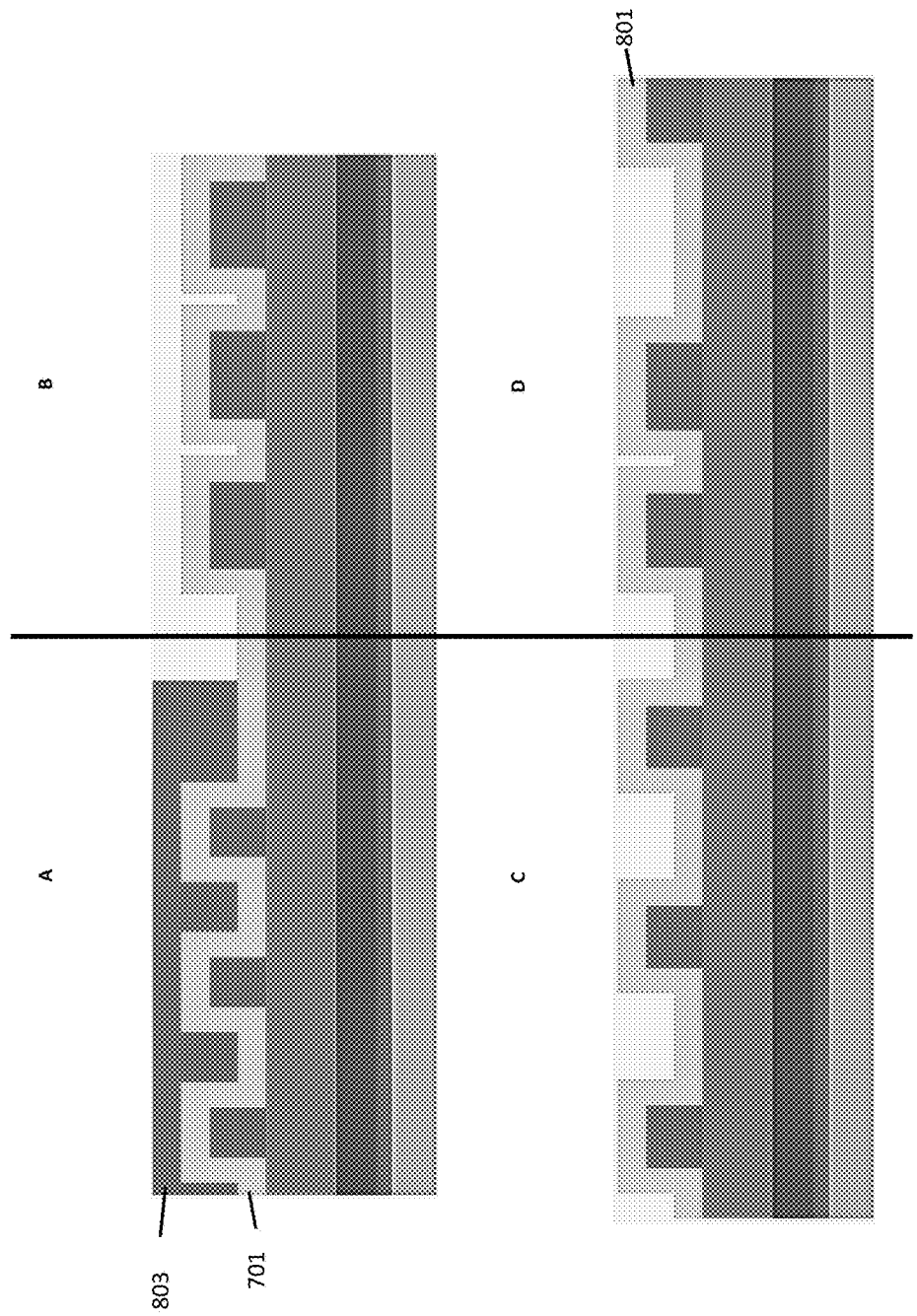

Adverting to FIG. 8, a second OPL 801 is deposited and planarized over the first spacer oxide layer 701. A second ARC 803 is formed over the planarized surface of the second OPL 801. A second PR 805 is formed over the second ARC 803 in a portion of the first device region A. Adverting to FIG. 9, the second ARC 803 and second OPL 801 are also removed with block lithography from the second, third, and fourth device regions B, C and D. A portion of the second ARC 803 and second OPL 801 are removed with block lithography from the first device region A. The second PR 805 is then removed from the first region.

Figure 10:
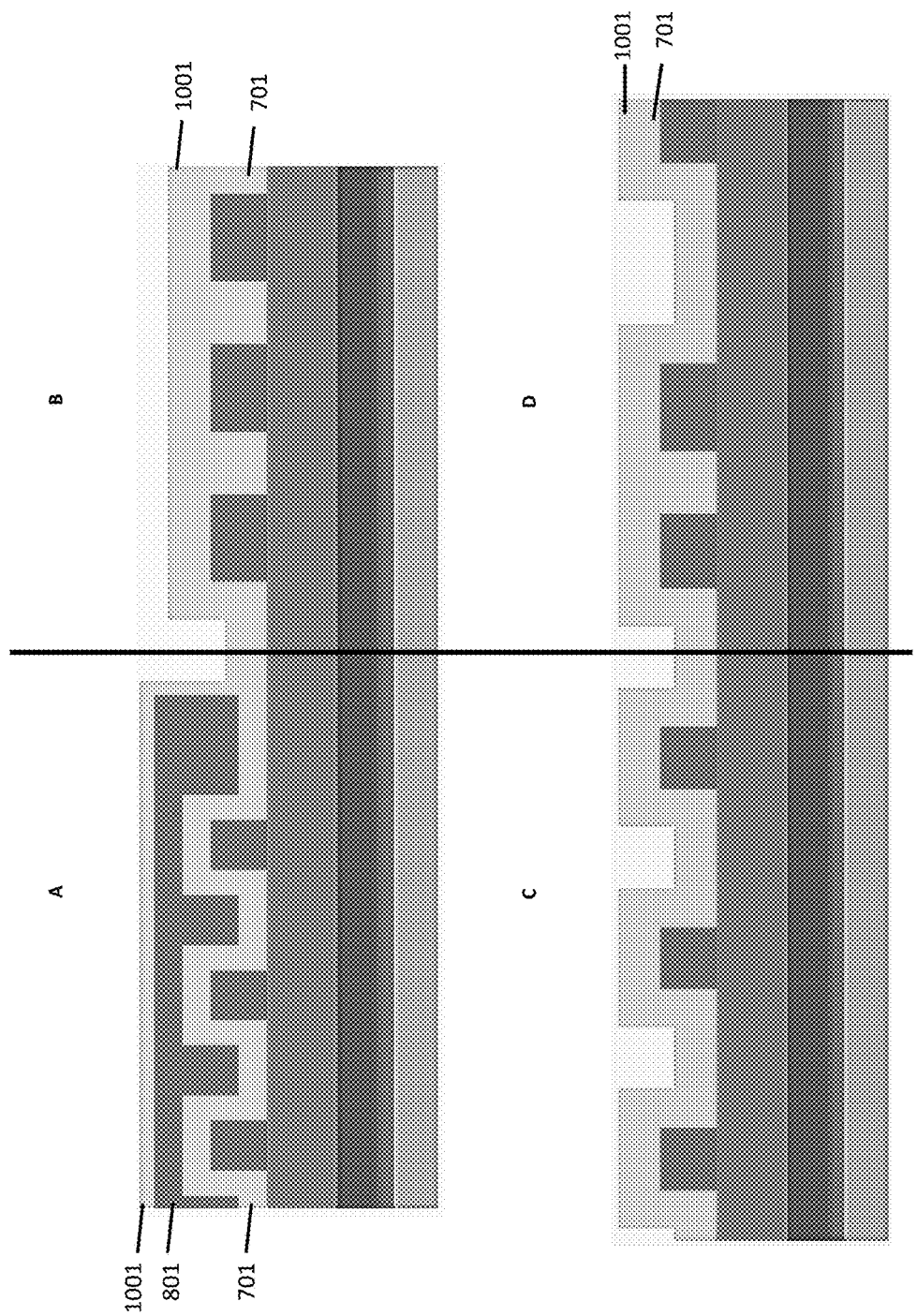
Figure 11:
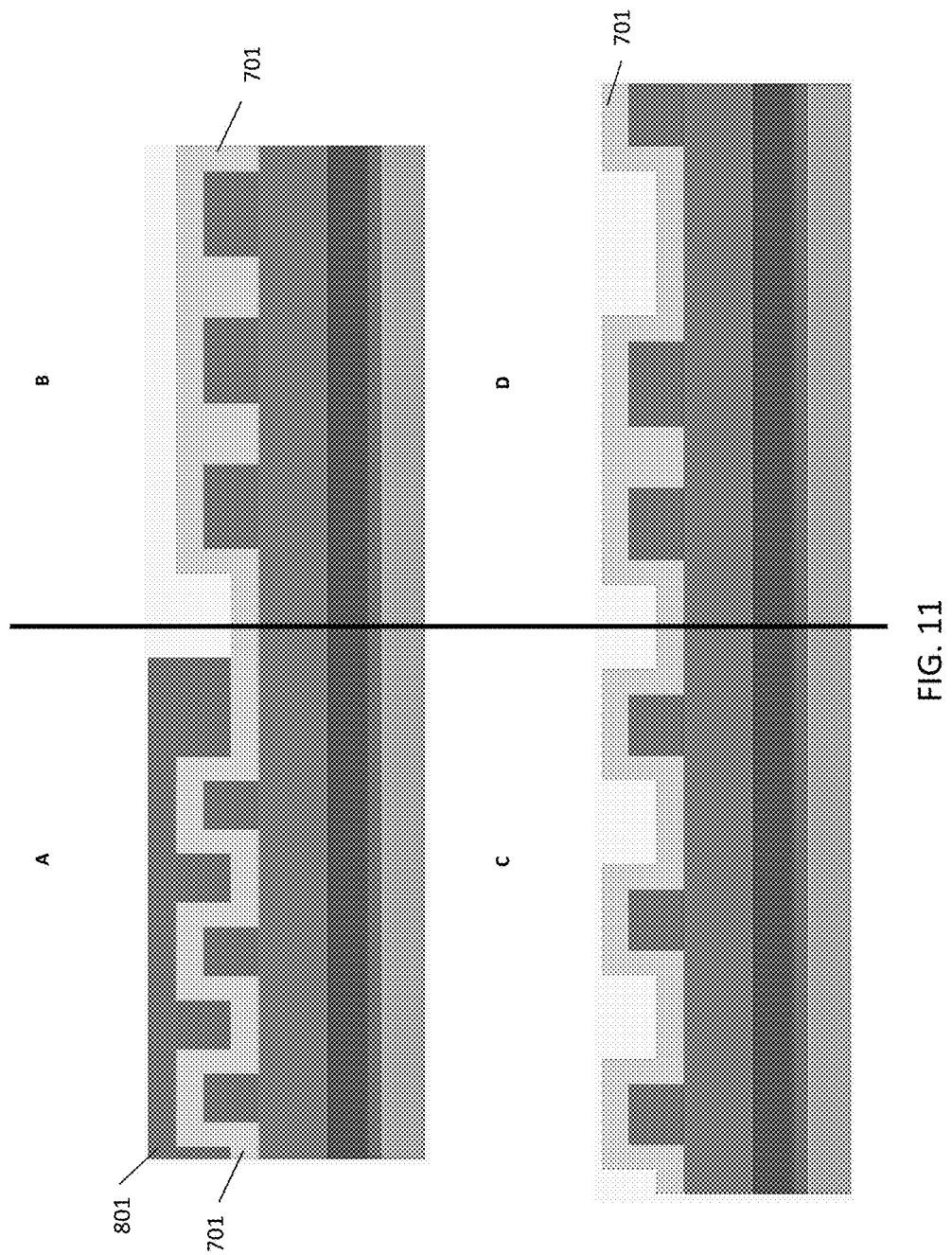
Figure 12:
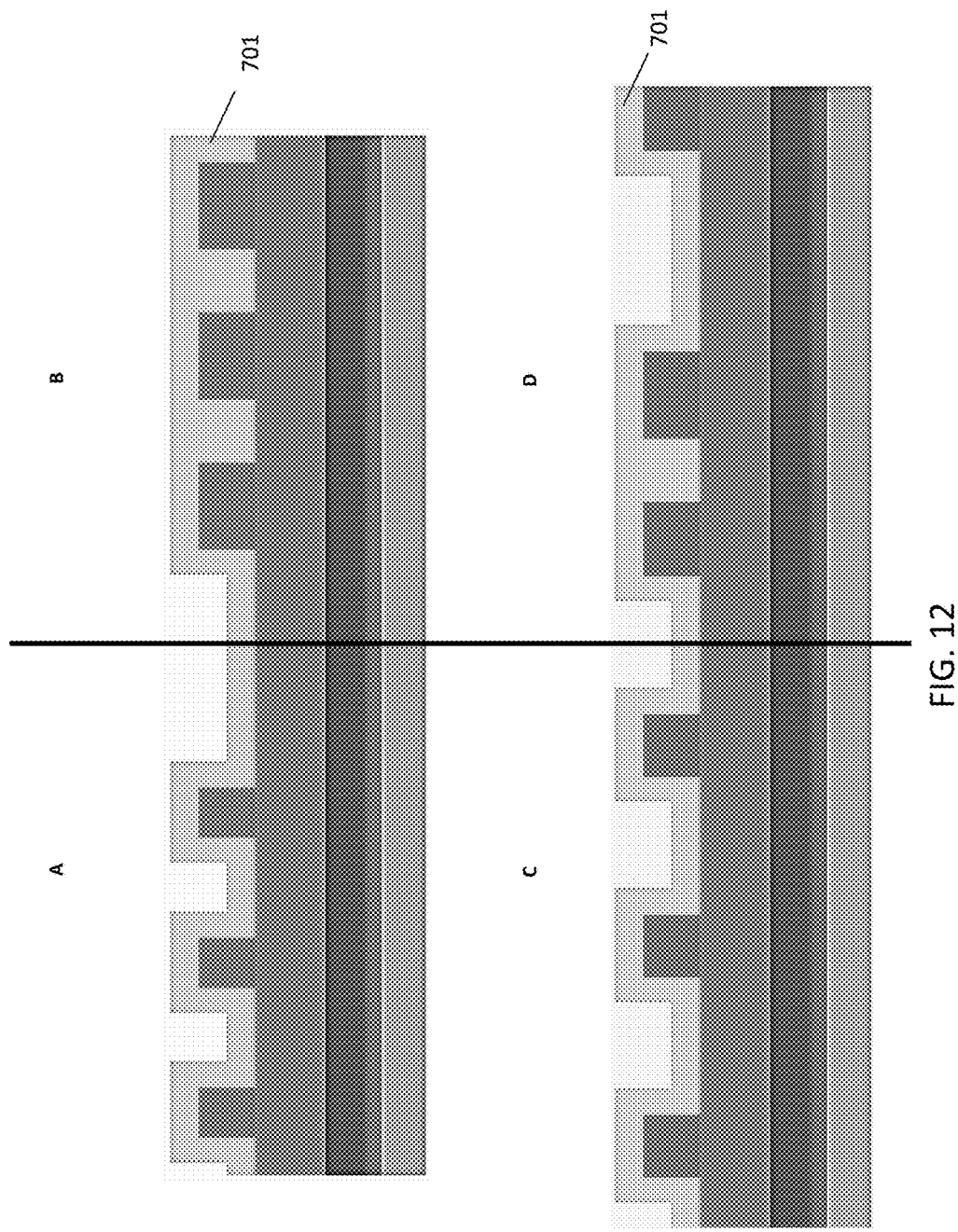

Adverting to FIG. 10, a second spacer oxide layer 1001 is deposited over all four device regions A, B, C and D. The second spacer oxide layer 1001 is deposited over the second OPL 801 in the first device region A and over and between gaps in the first spacer oxide layer 701 in device regions B, C and D. In FIG. 11, the second spacer oxide layer 1001 is etched back to expose the second OPL 801 in the device region A, and the second spacer oxide layer 1001 is substantially removed in the device regions B, C and D (except where the spacer oxide 1001 fills in gaps) to substantially expose the first spacer oxide layer 701. In FIG. 12, the second OPL 801 in the first device region A is stripped away such that the first spacer oxide layer 701 substantially remains in all four device regions A, B, C and D.

Figure 13:
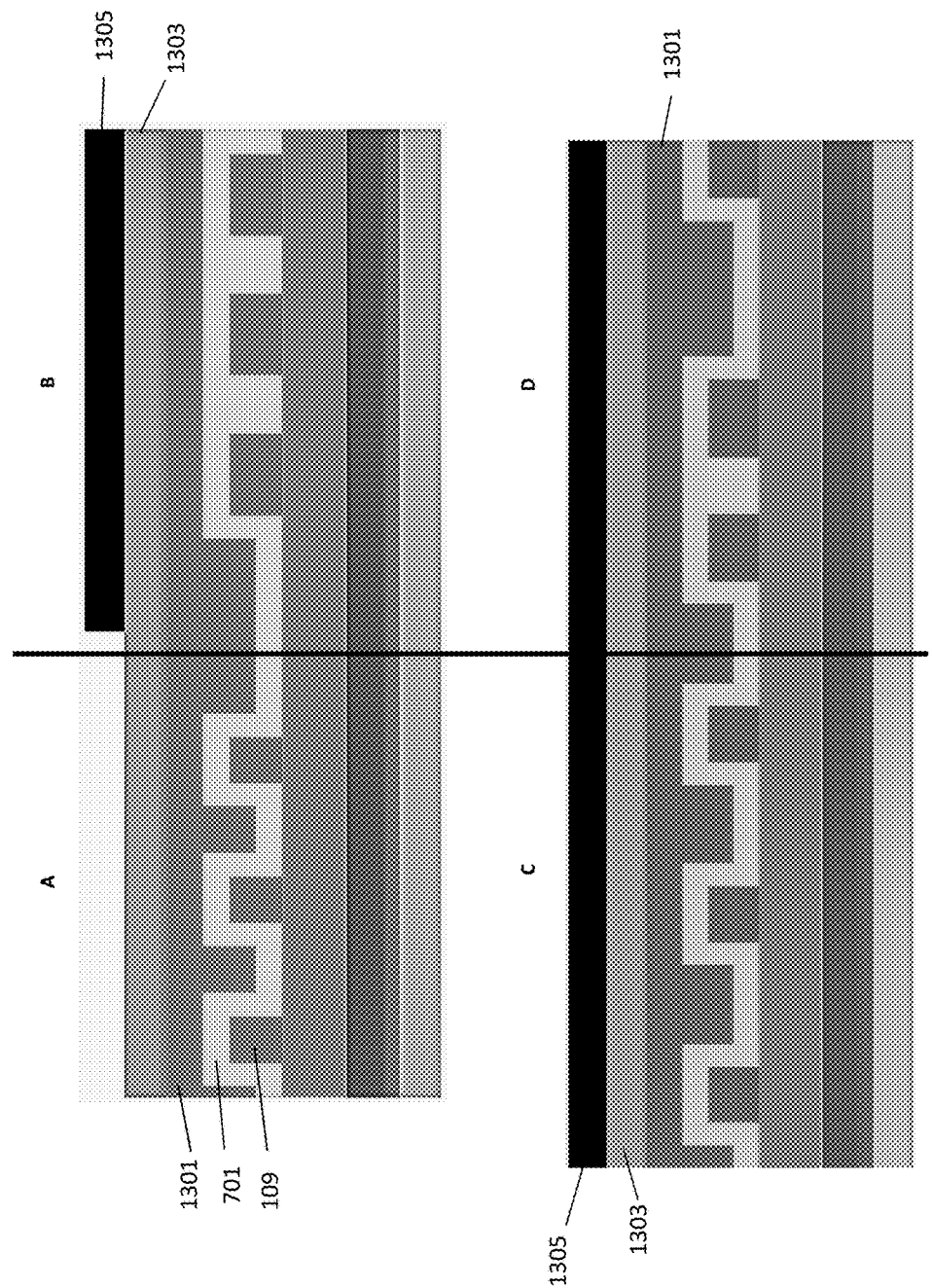

Adverting to FIG. 13, a third OPL 1301 is deposited and planarized in each of the four device regions A, B, C and D over the first spacer oxide layer 701. A third ARC 1303 is formed over the third OPL 1301. A third PR 1305 is formed in a portion of the second device region B and in the third and fourth device regions C and D. The third OPL 1301 is composed of the same material as the top mandrel 109 and separated therefrom by the first spacer oxide layer 701.

Figure 14:
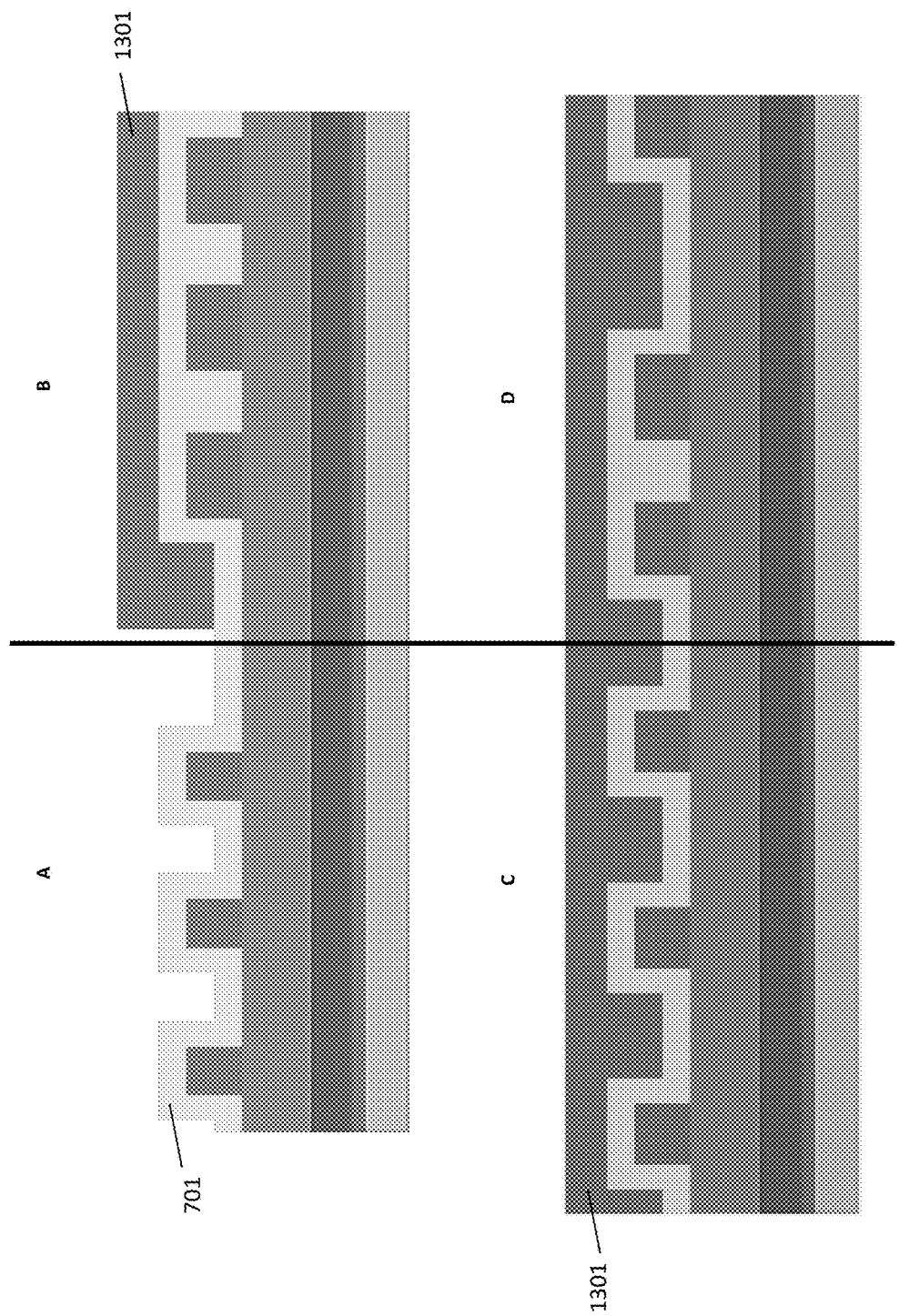

As illustrated in FIG. 14, a block lithography step such as RIE is performed to remove the third ARC 1302 and the third OPL 1301 in the first device region A and a portion of the third OPL 1031 in the second device region B. The third PR 1305 and remaining third ARC 1302 in the second, third and fourth device regions B, C and D are removed to expose the upper planarized surface of the third OPL 1301.

Figure 15:
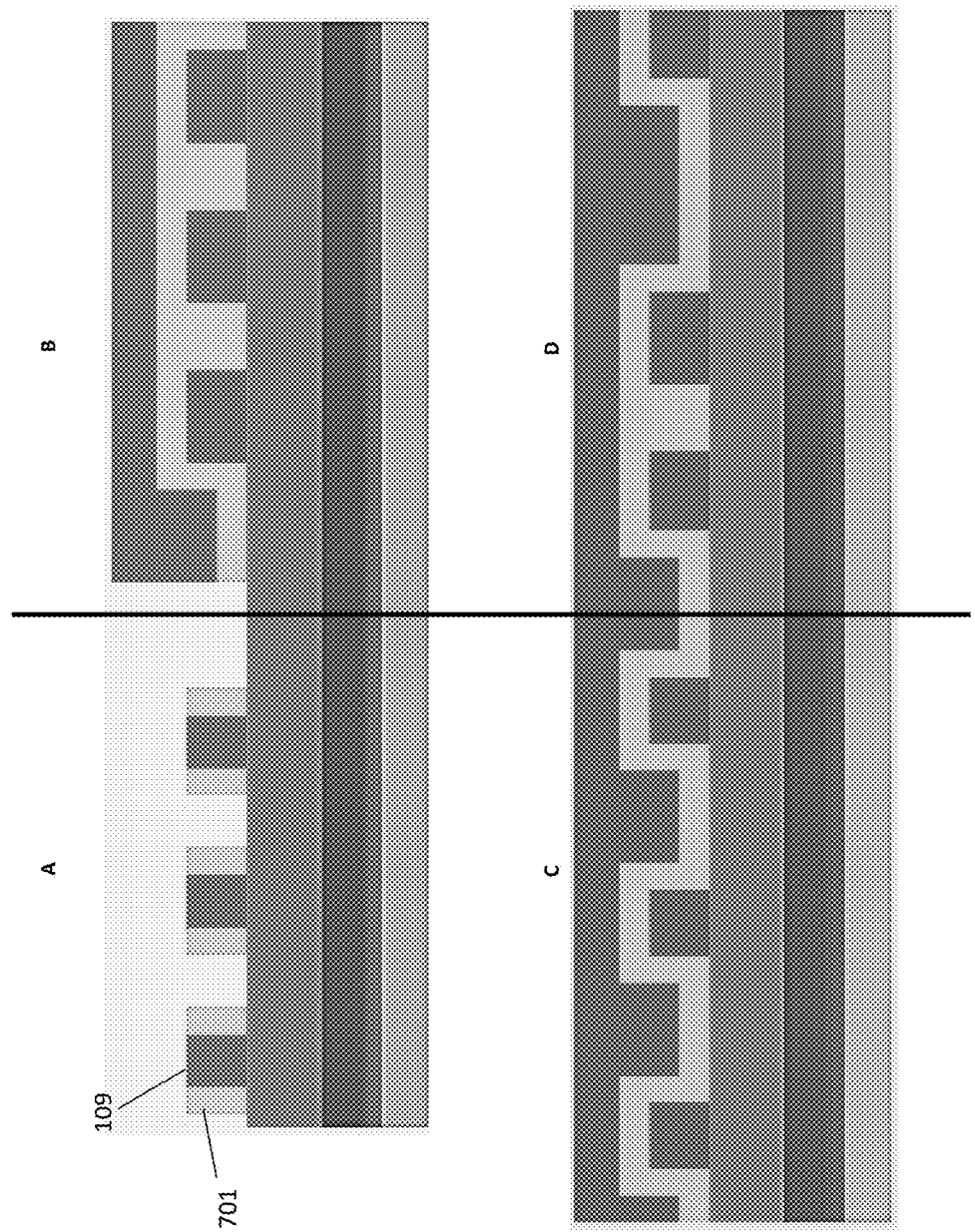
Figure 16:
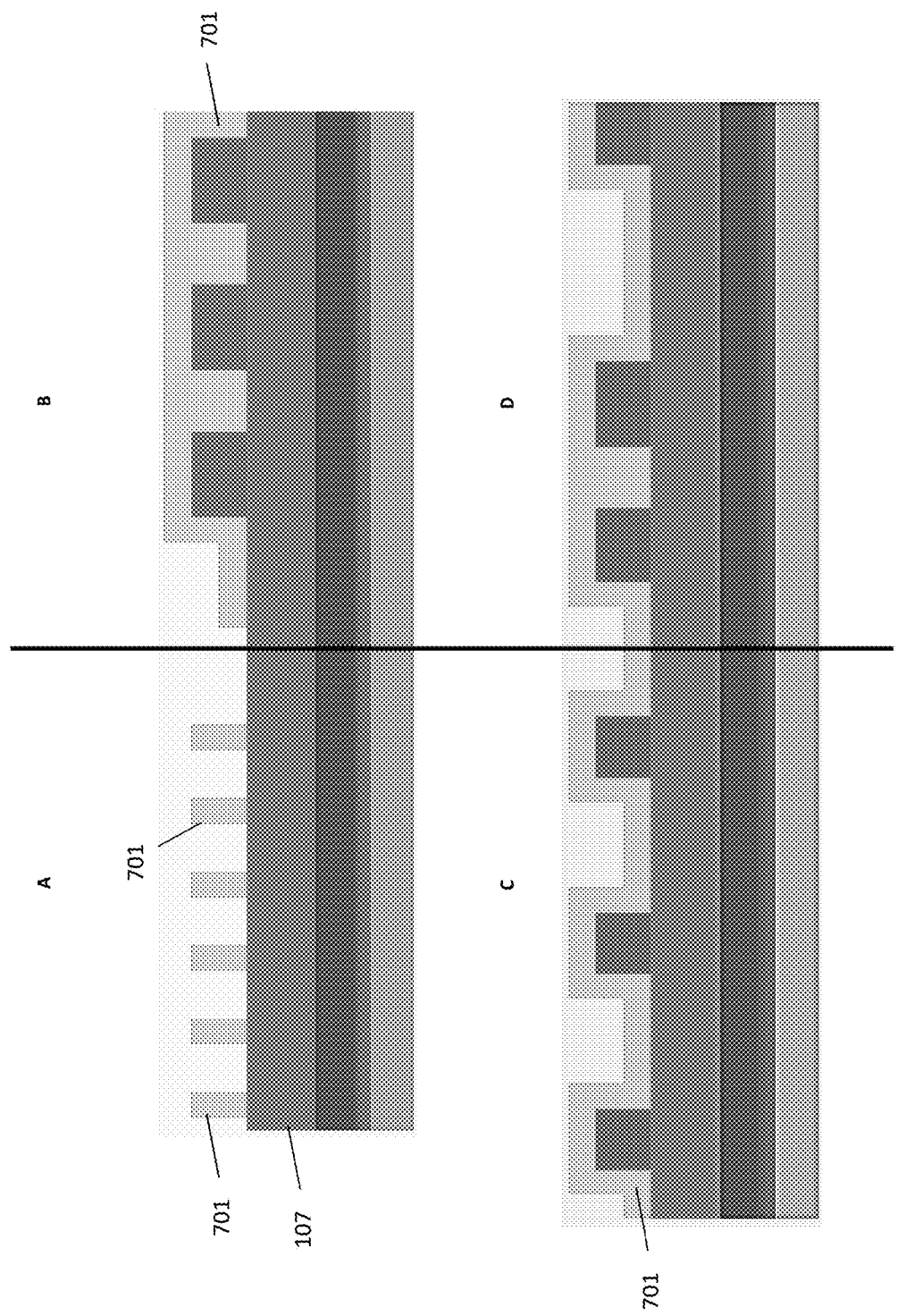

Adverting to FIG. 15, horizontal portions of the first spacer oxide 701 in the first device region A are removed to expose an upper surface of the top mandrel 109. As shown in FIG. 16, the top mandrel 109 is removed in the first device region A, and concurrently the third OPL 1301 is removed in the second, third and fourth device regions B, C and D. The first oxide layer 701 remains in each of the device regions over the bottom mandrel 107.

Figure 17:
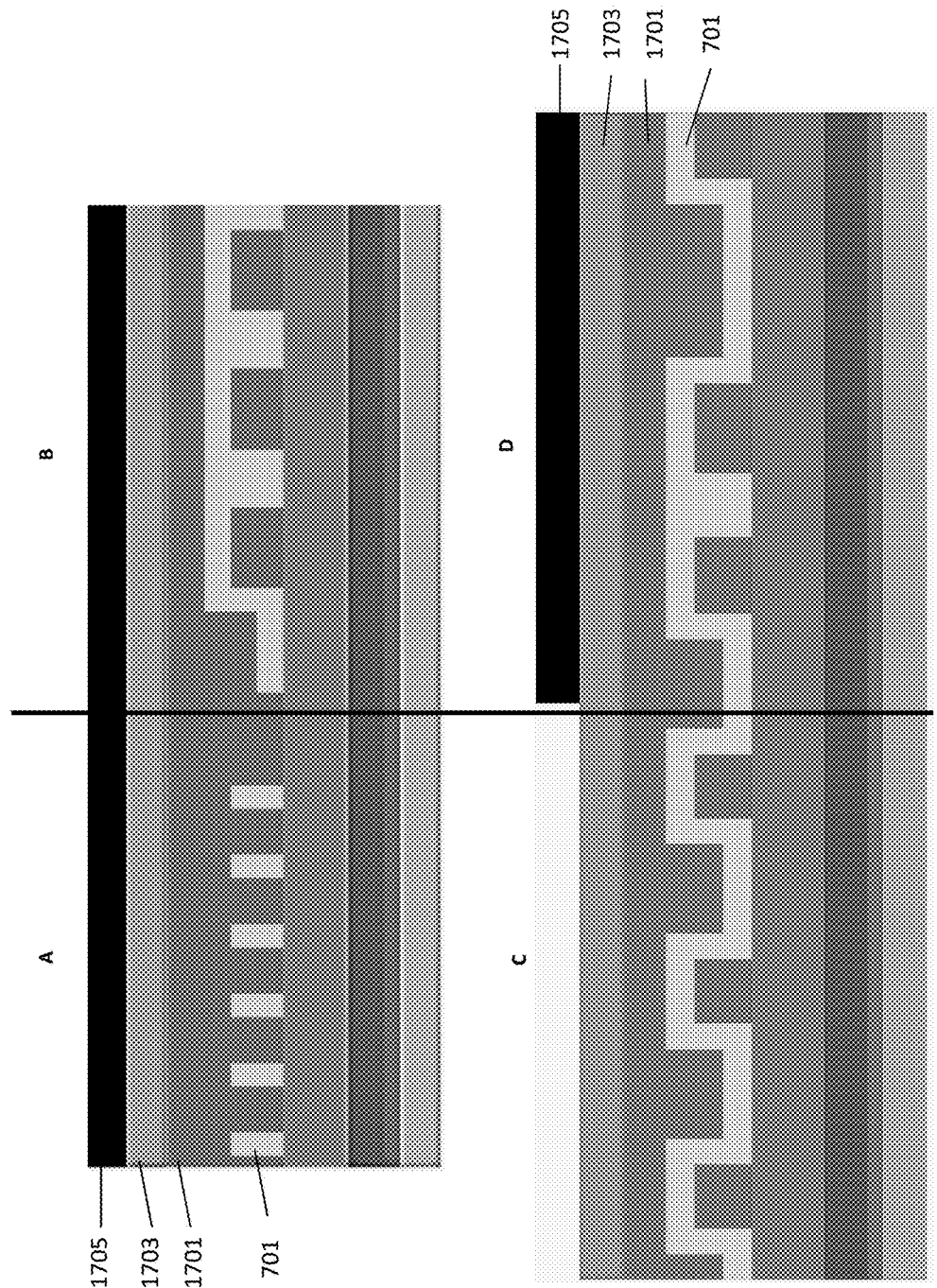
Figure 18:
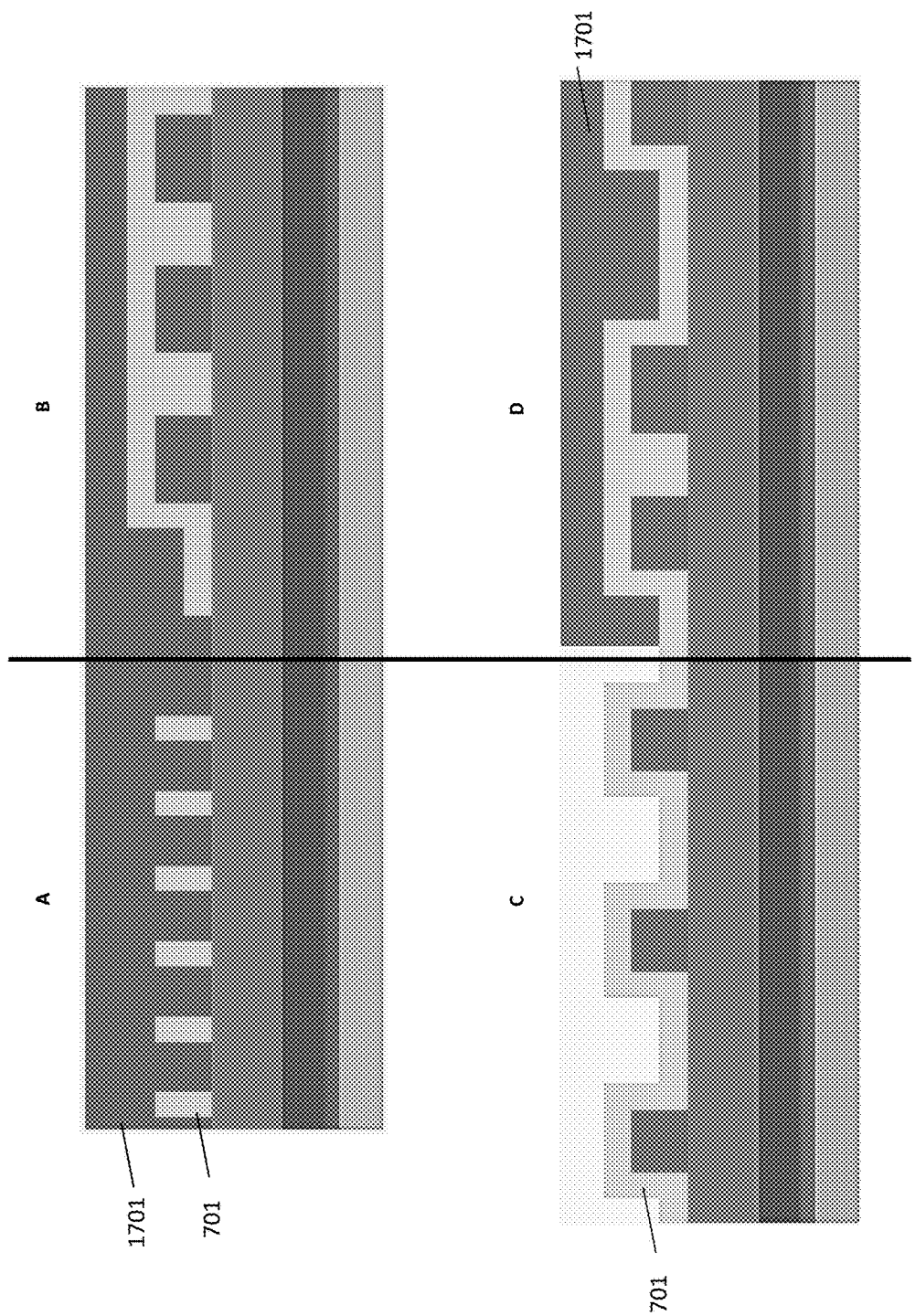

In FIG. 17, a fourth OPL 1701 is formed and planarized over the first spacer oxide layer 701. A fourth ARC 1703 is formed over the fourth OPL 1701. A fourth PR 1705 is formed in a portion of the fourth device region D and in the first and second device regions A and B. With a block lithography step, the fourth ARC 1703 and the fourth OPL 1701 in the third device region C and in a portion of the fourth device region are removed. The remaining fourth PR 1705 and fourth ARC are then removed, as illustrated in FIG. 18. The first spacer oxide layer 701 is exposed in the third device region C in FIG. 18.

Figure 19:
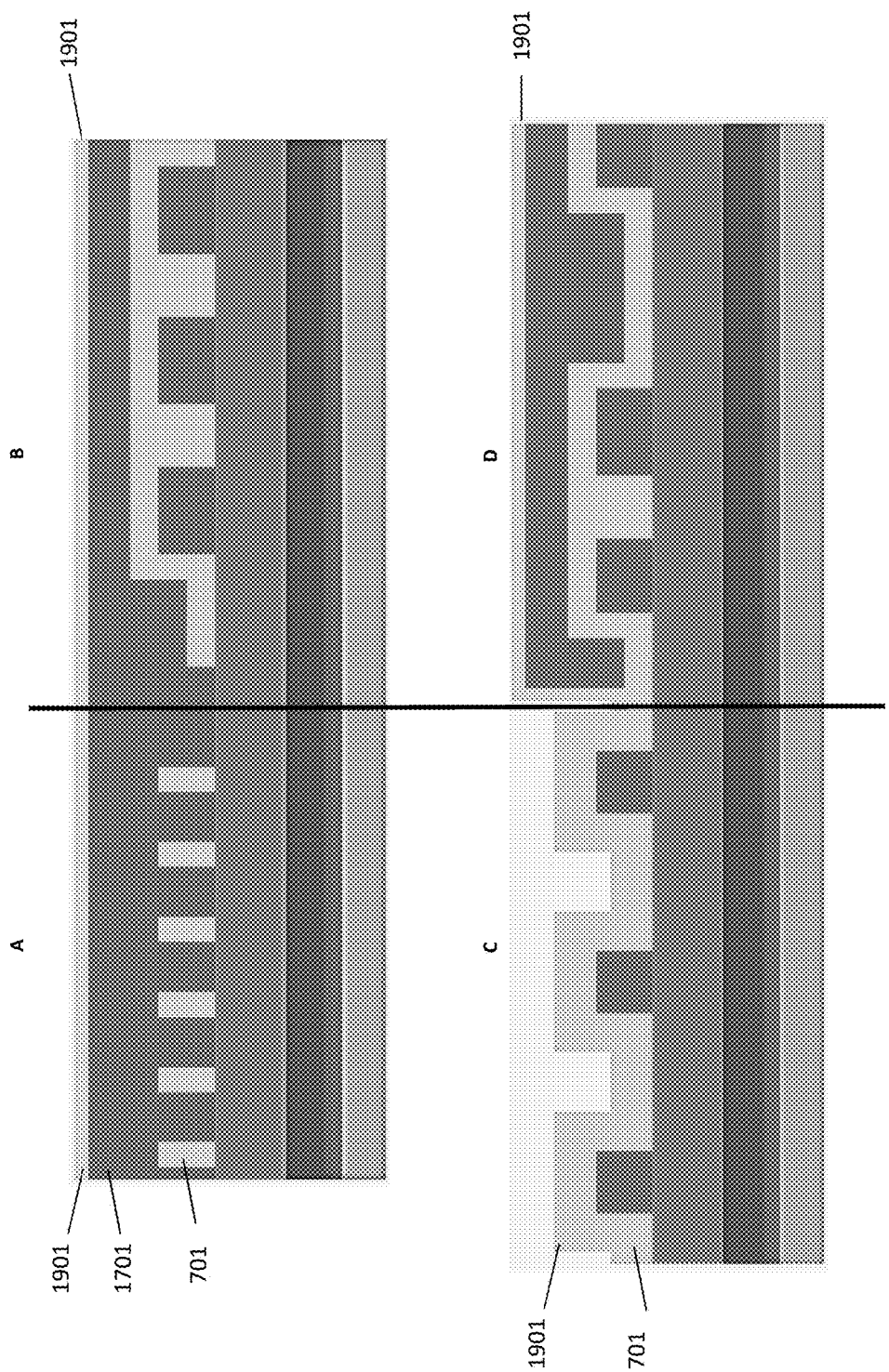
Figure 20:
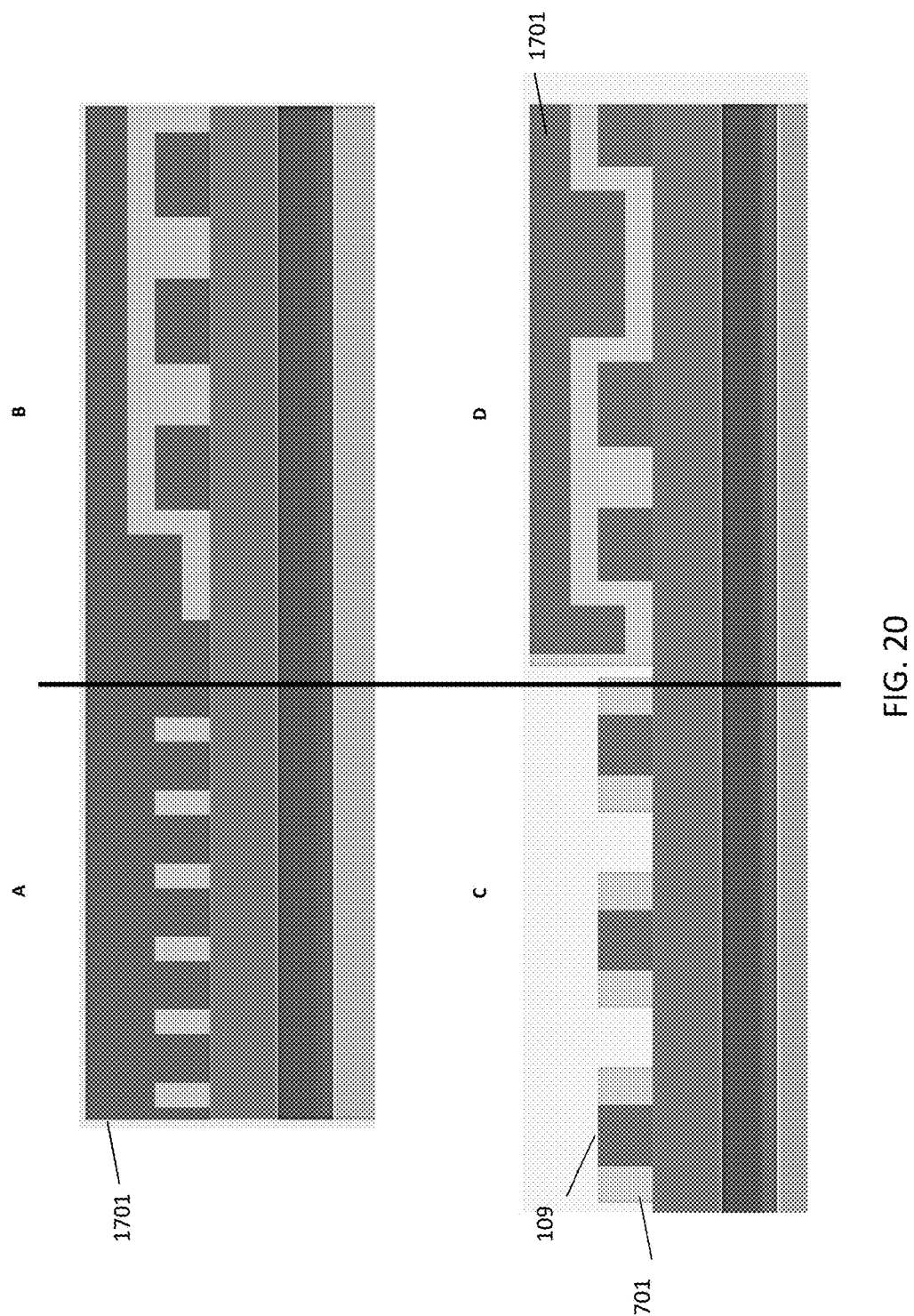
Figure 21:
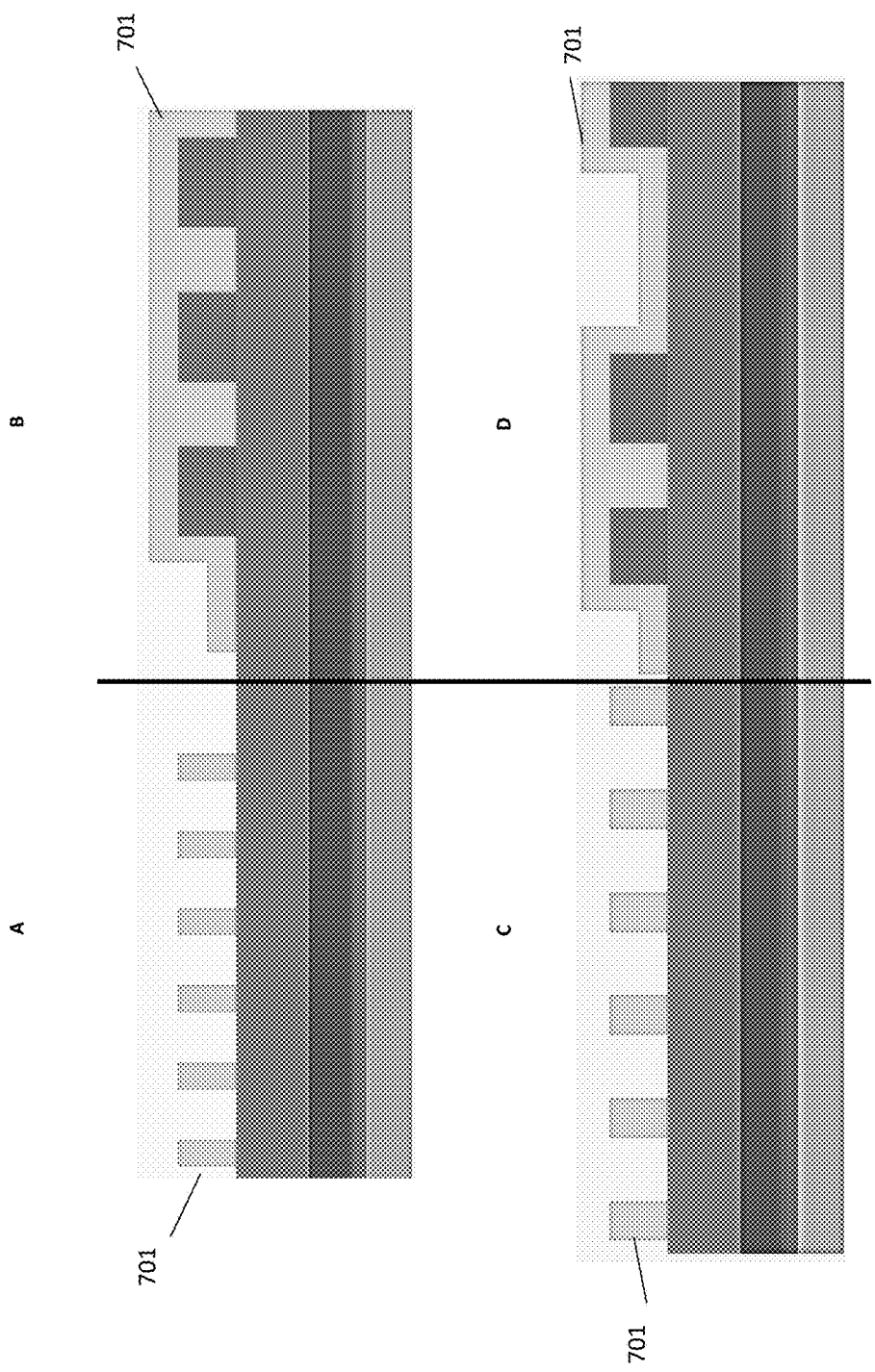

Adverting to FIG. 19, a second spacer oxide layer 1901 is formed in each of the four device regions A, B, C and D. In particular, the second oxide spacer layer 1901 is formed over the fourth OPL 1701 in the first, second and fourth device regions A, B and D. As shown in FIG. 20, horizontal portions of the second spacer oxide layer 1901 in the third device region C are removed to expose an upper surface of the top mandrel 109. As shown in FIG. 21, the remaining fourth OPL 1701 is stripped in the first, second and fourth regions, and the top mandrel 109 is concurrently removed in the third device region. The fourth OPL 1701 and the top mandrel 109 are composed of the same material.

Figure 22:
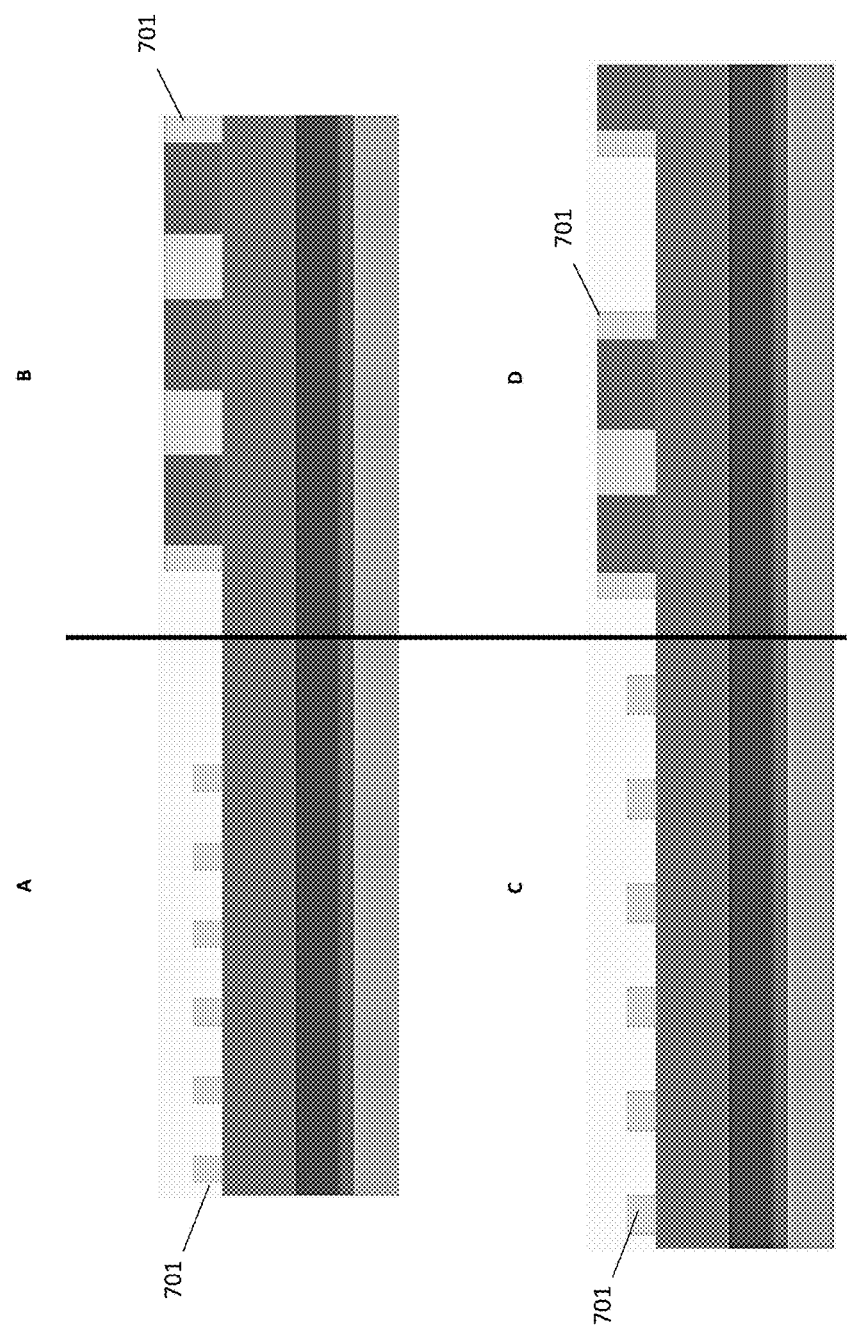
Figure 23:
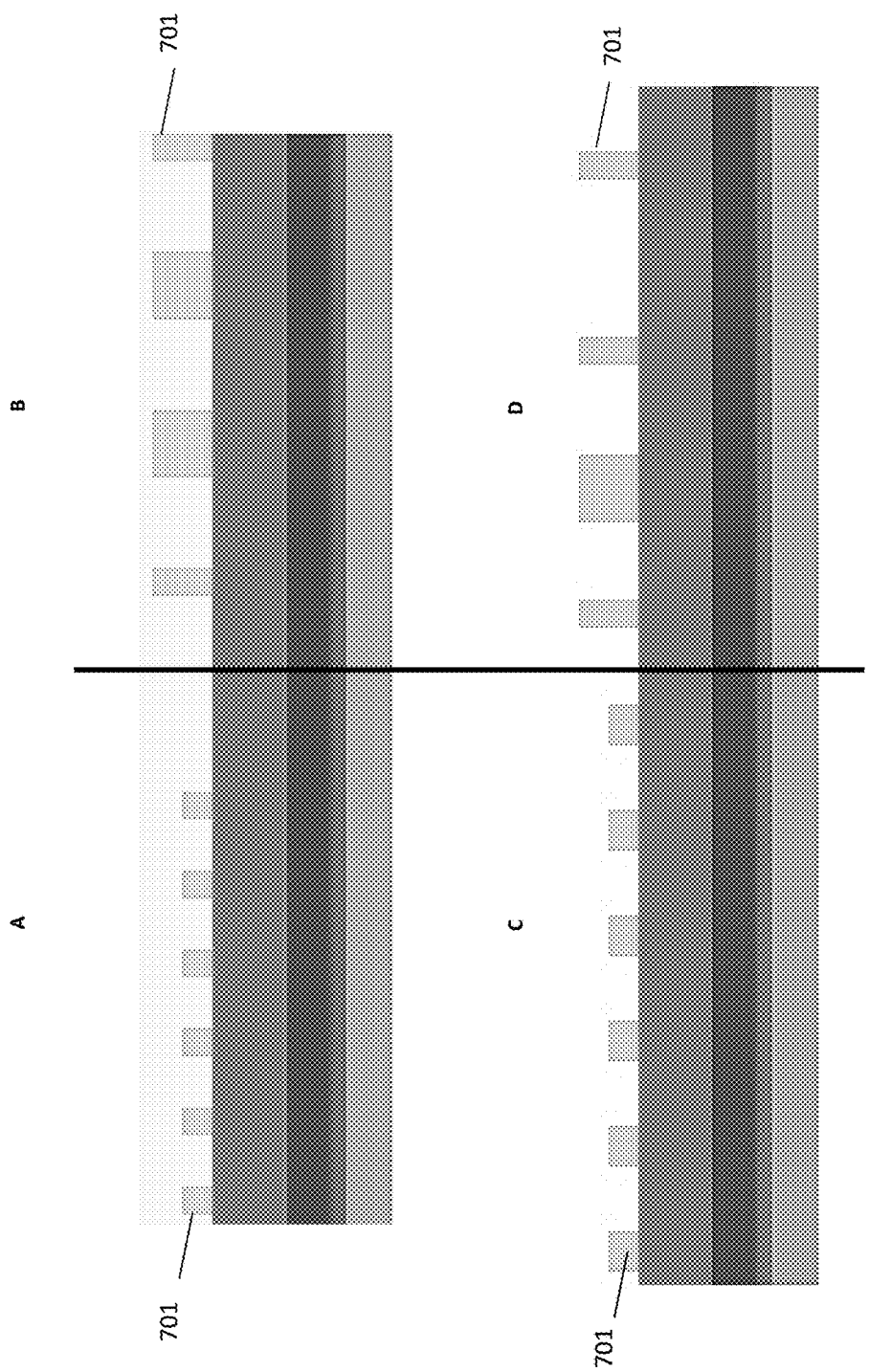

Adverting to FIG. 22, a spacer oxide etch back is performed to remove the first spacer oxide layer 701 down to an upper surface of the top mandrel 109 in the second and fourth device regions B and D. The first spacer oxide 701 is removed from bottom mandrel 107 in the second and fourth device regions B and D and partially removed from the first and third device regions A and C to a depth equal to the thickness removed from the top mandrels during the spacer etch back. As shown in FIG. 23, the top mandrel 109 is removed from the second and fourth device regions B and D. A pitch of the remaining first spacer oxide layer 701 is different in each of the four device regions A, B, C and D.

Figure 24:
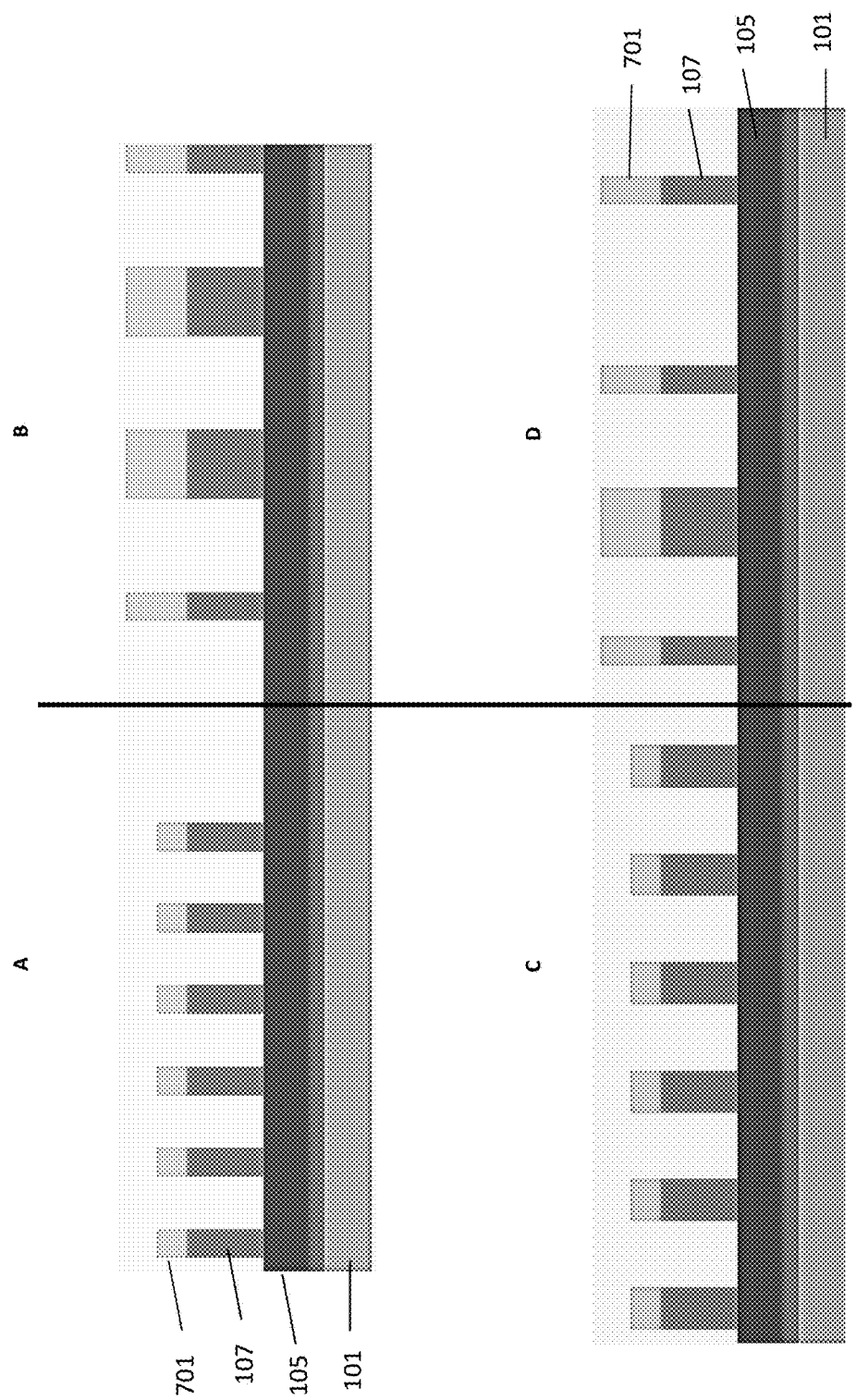
Figure 25:
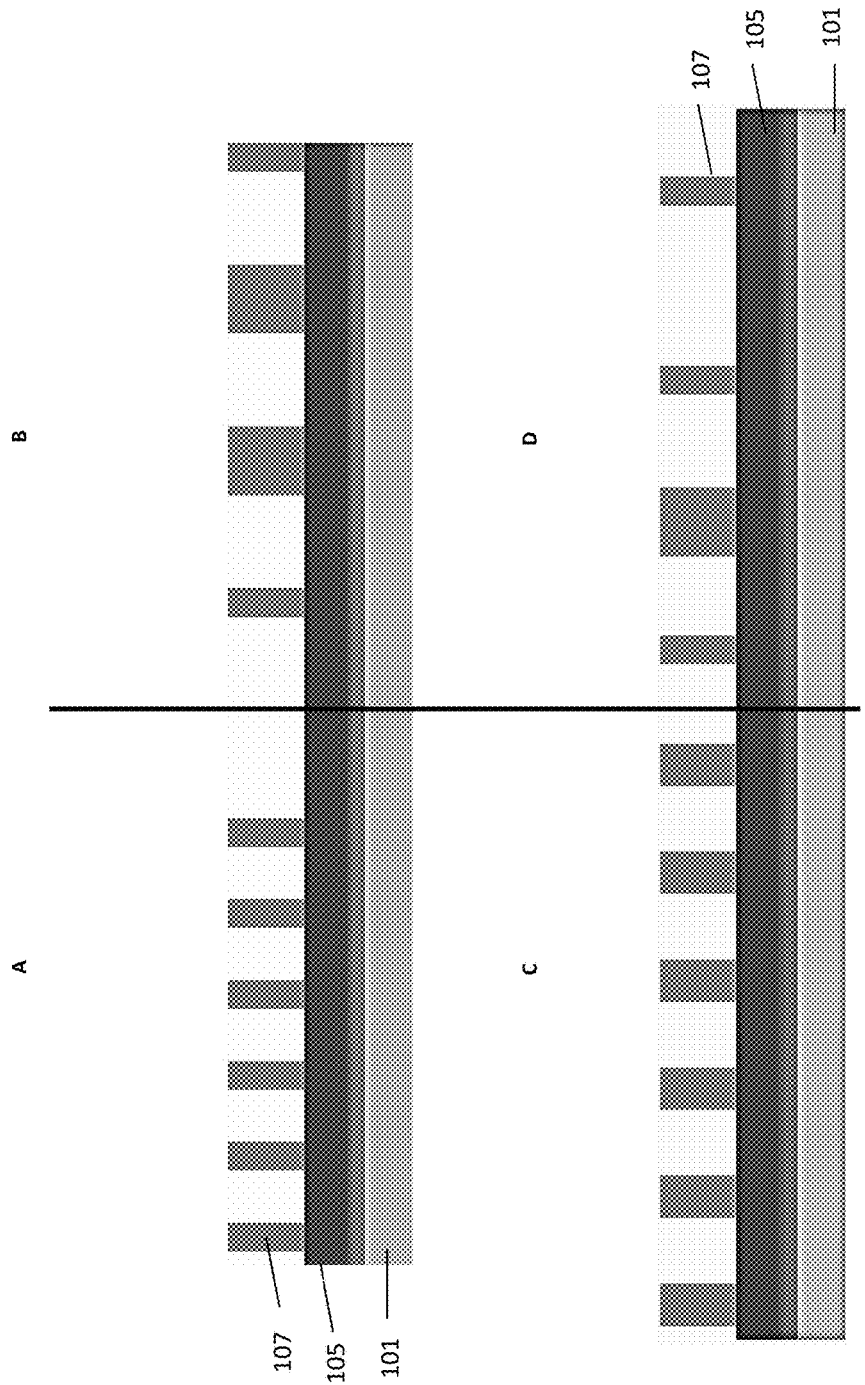
Figure 26:
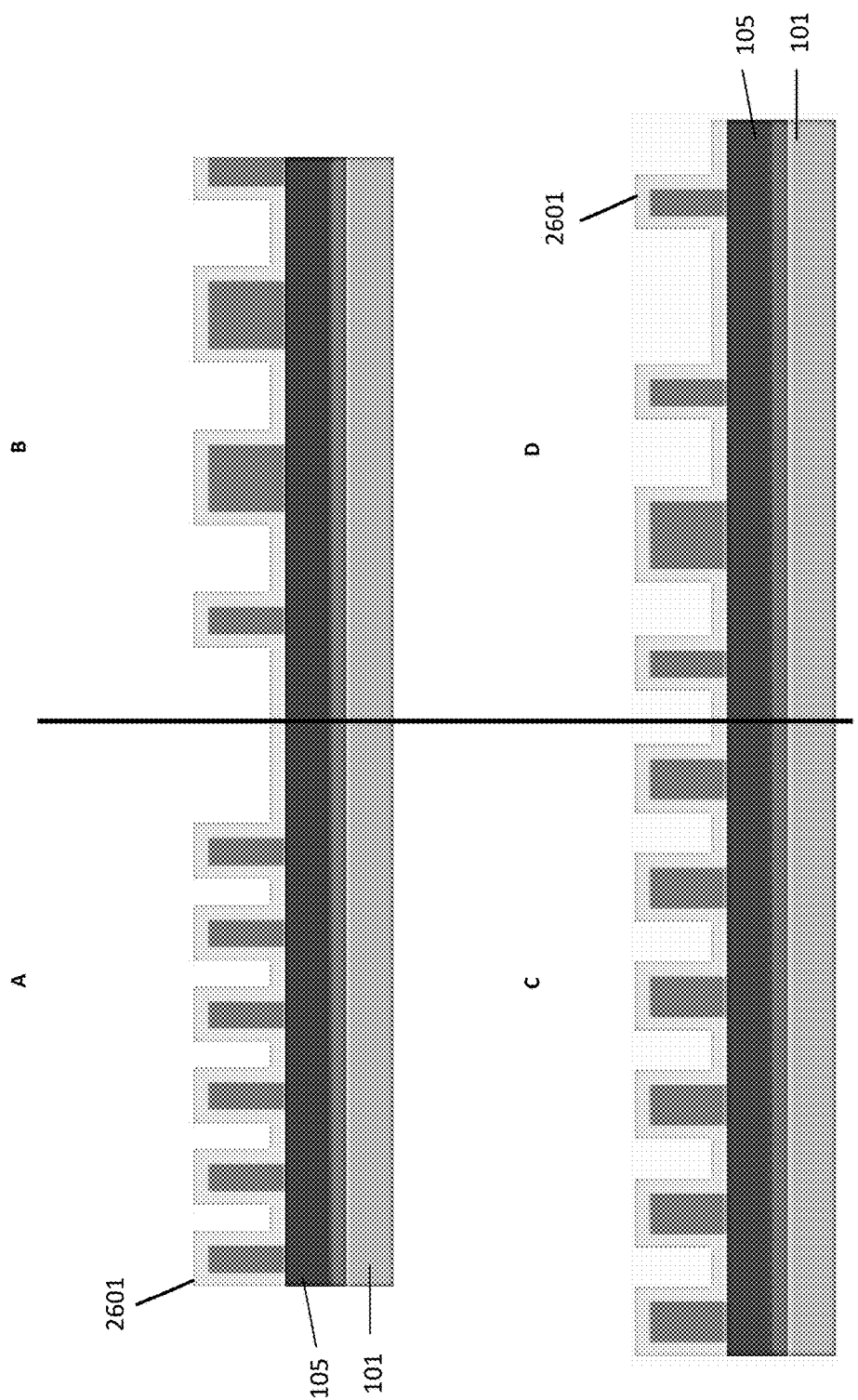

Adverting to FIG. 24, the bottom mandrel 107 is etched by RIE to the bottom spacer 105, which is formed over the fin channel 101 using the remaining first spacer oxide layer 701 as a mask. As shown in FIG. 25, the remaining the spacer oxide layer 701 is removed by BHF. In FIG. 26, a conformal spacer oxide layer 2601 is conformal deposited over the bottom mandrel 107 and an upper surface of the bottom spacer 105.

Figure 27:
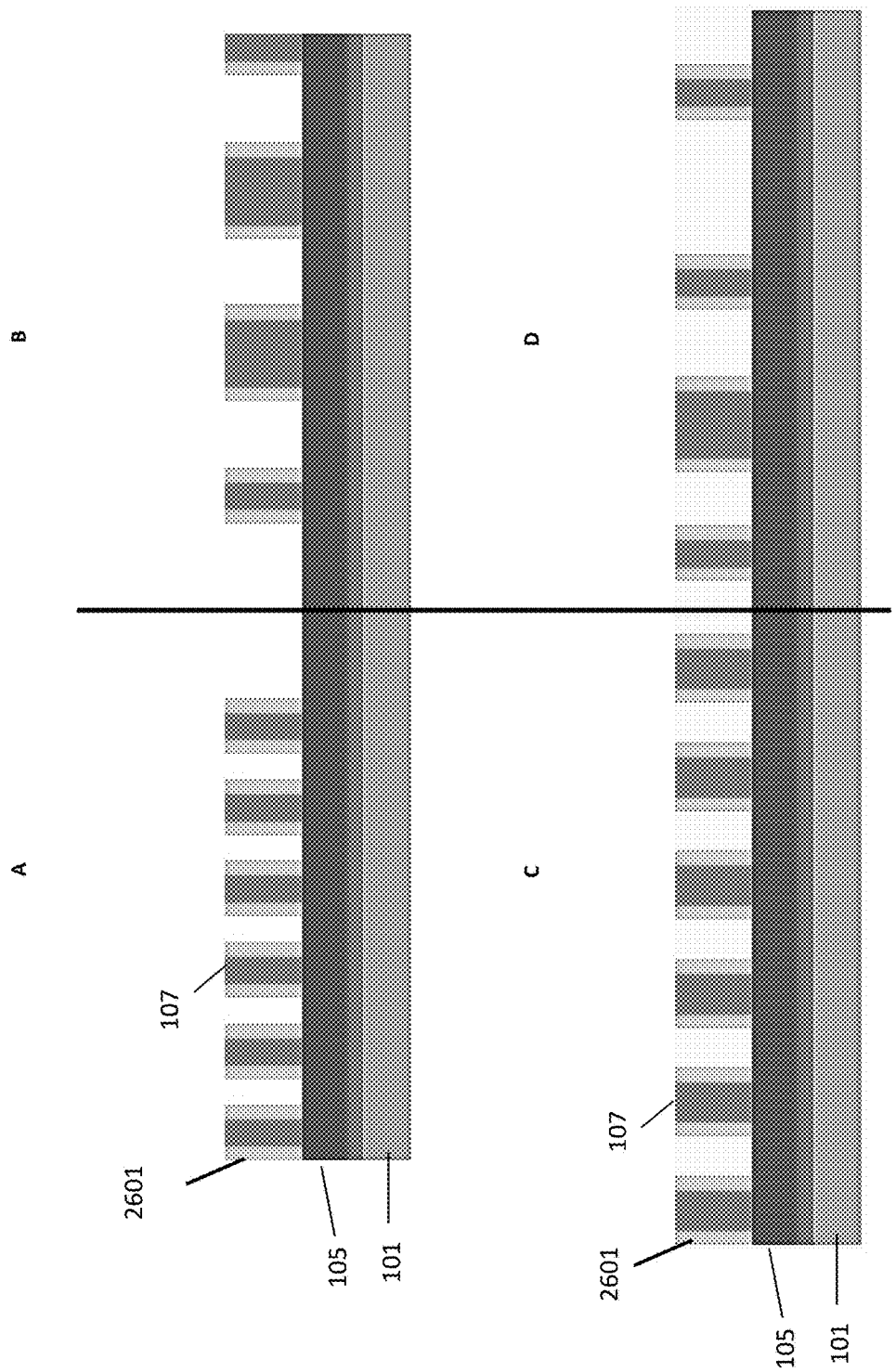
Figure 28:
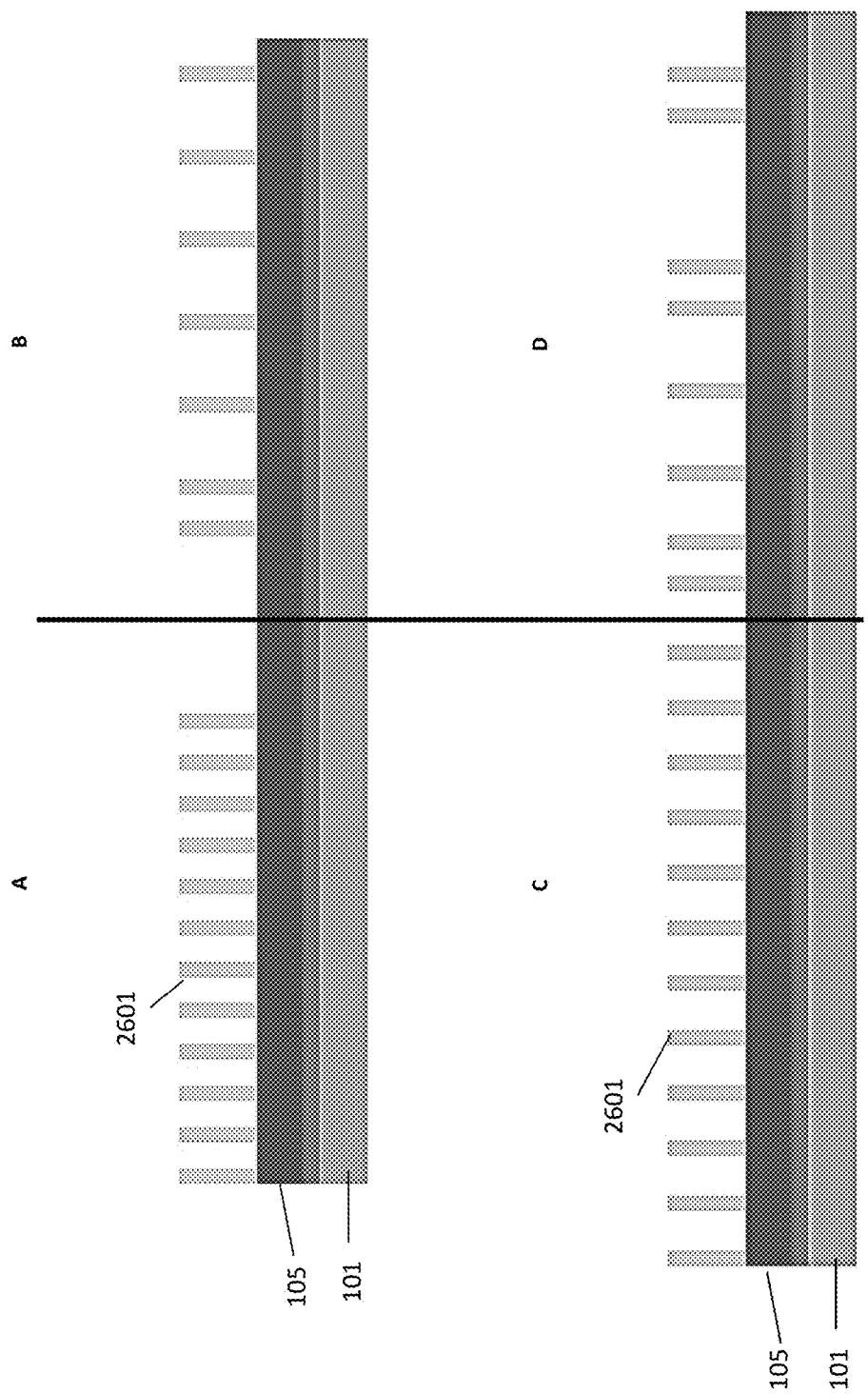

Adverting to FIG. 27, horizontal portions of the conformal spacer oxide layer 2601 are removed in each of the four device regions A, B, C and D. As shown in FIG. 28, the bottom mandrel is removed, wherein a pitch of remaining conformal spacer oxide layer 2601 is different in each of the four device regions A, B, C and D.

Figure 29:
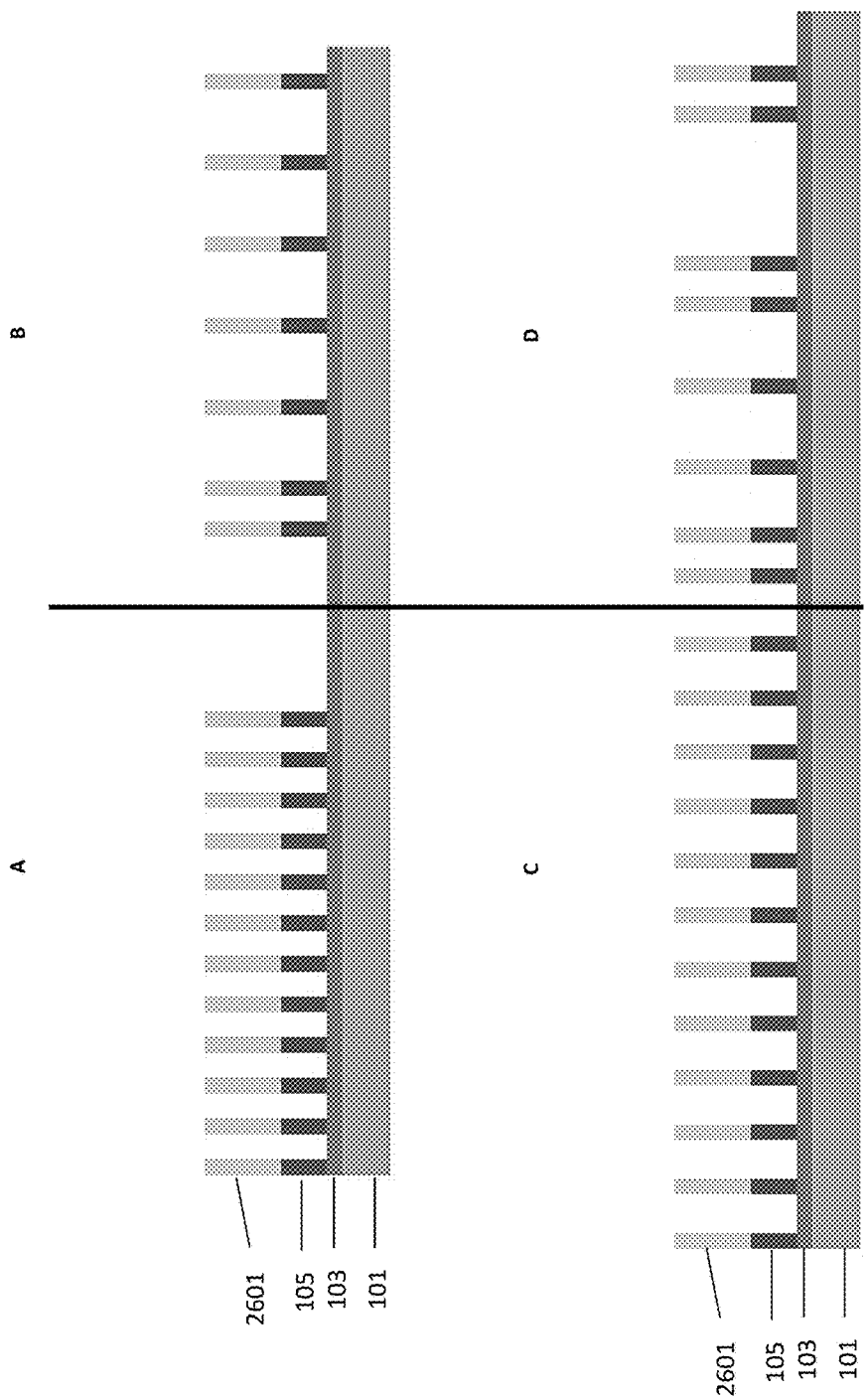
Figure 30:
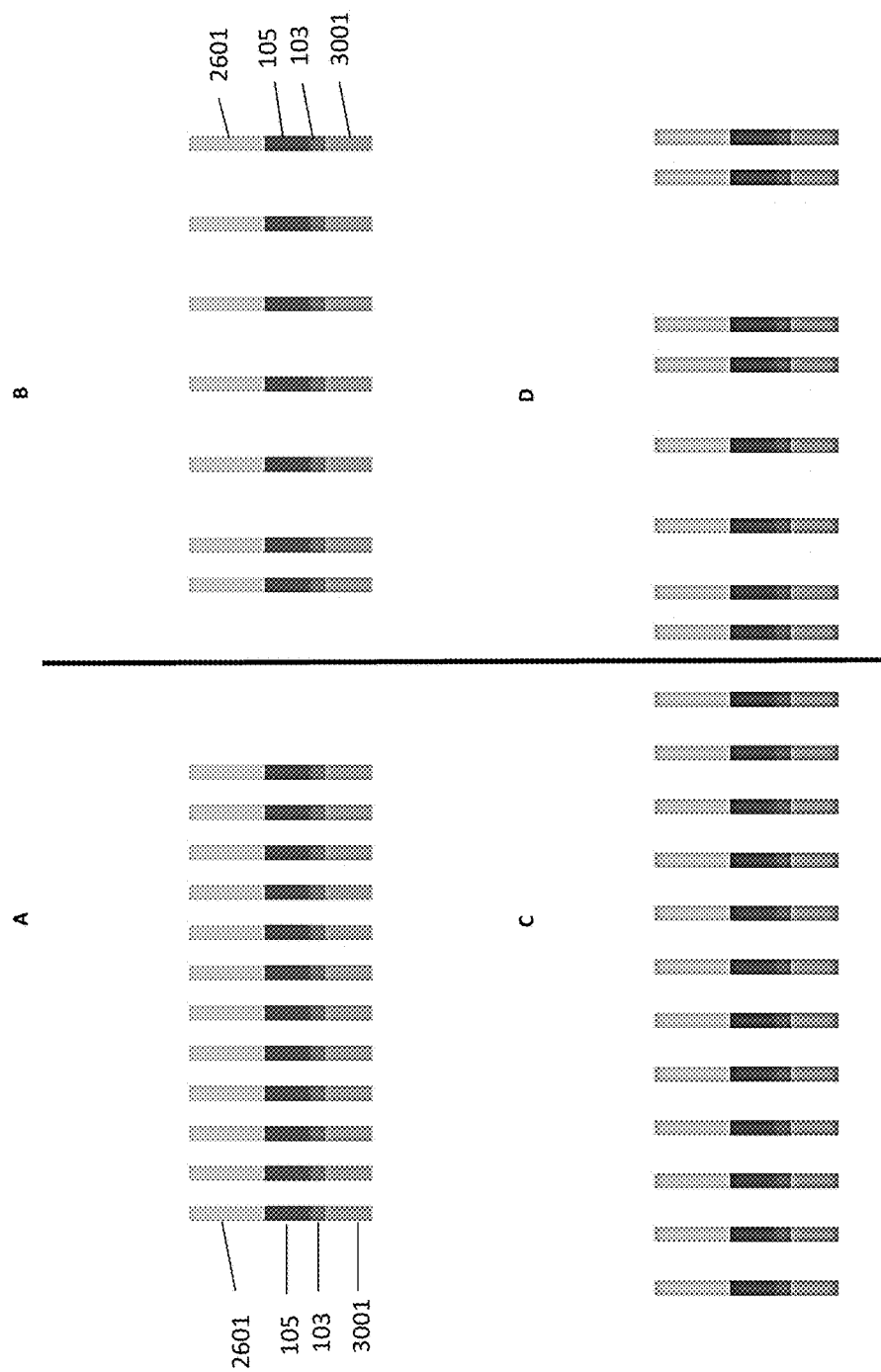
Figure 31:
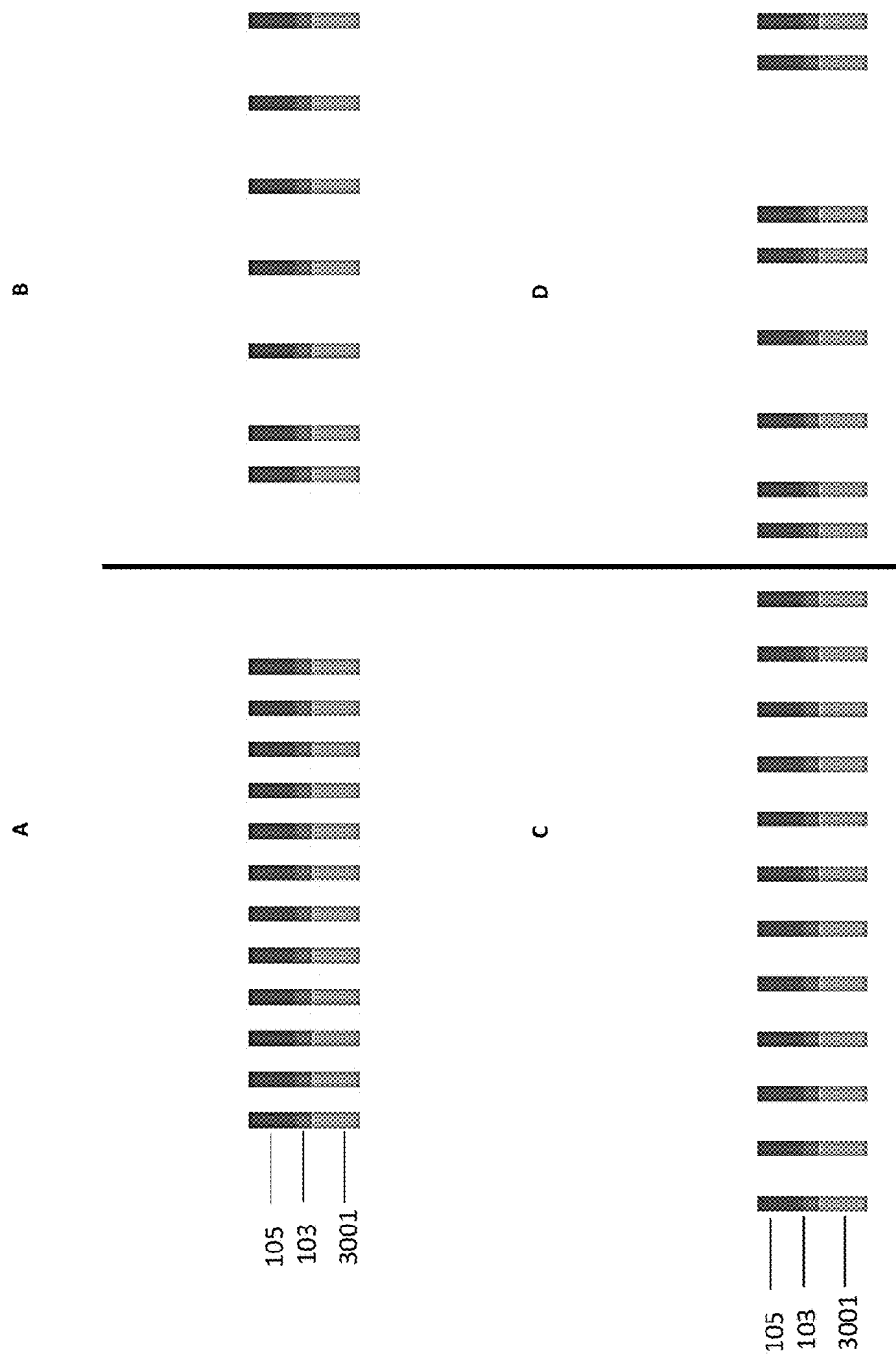

Adverting to FIG. 29, the bottom spacer is etched with RIE down to the pad oxide layer 103, formed over the fin channel 101, using remaining conformal spacer oxide layer 2601 as a mask. In FIG. 30, the fin channel 101 is etched with RIE through the pad oxide layer 103 to form fins 3001 in each of the four device regions A, B, C and D. The four device regions can include an EG device (e.g., device region A), SG device (e.g., device region B), static random-access memory (SRAM) 111 device (e.g., device region C) and SRAM 122 device (e.g., device region D). A pitch of the fins 3001 in each of the four device regions A, B, C and D is different. No punch-through errors are generated with the fin channel RIE on an open area. In FIG. 31, the remaining conformal spacer oxide layer 2601 is removed with BHF. Certain select fins 3001 in one or more of the four device regions A, B, C and D can be designated as dummy fins to be cut.

The embodiments of the present disclosure can achieve several technical effects including the prevention of punch-through errors during the processing of fins in semiconductor devices. Fin cut (FH) can be skipped in SRAM integration which provides for better process margin. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a spacer layer over a fin channel, the fin channel being formed in four different device regions, the four different device regions sharing one substrate;
forming a bottom mandrel over the spacer layer;
forming a top mandrel directly over the bottom mandrel, wherein the top and bottom mandrels comprises different materials;
forming a buffer oxide layer over the top mandrel;
forming a first organic planarizing layer (OPL) over the buffer oxide layer;
forming an anti-reflective coating (ARC) over the first OPL;
forming a photoresist (PR) over the ARC and patterning the PR; and
etching, at the same time, the first OPL, ARC, buffer oxide, and top mandrel with the pattern of the PR in the four different device regions,
wherein a pitch of the PR as patterned is different in each of the four device regions.

2. The method according to claim 1, wherein:
the bottom mandrel comprises amorphous silicon (a-Si), the top mandrel comprises amorphous carbon (aC), and the buffer oxide layer comprises silicon dioxide ($SiO_2$).

3. The method according to claim 2, wherein:
the fin channel comprises silicon germanium (SiGe), and the spacer layer comprises silicon nitride (SiN).

4. The method according to claim 1, further comprising:
etching the ARC and OPL using the PR as a mask;
removing the PR;
etching the buffer oxide layer;
removing the ARC;
etching the top mandrel using the OPL and buffer oxide as a mask; and
removing the OPL and buffer oxide.

5. The method according to claim 4, further comprising:
etching through the top mandrel down to the bottom mandrel using the buffer oxide layer as a mask to form a patterned top mandrel in each of the four device regions; and
removing the buffer oxide layer,
wherein a pitch of the patterned top mandrel is different in each of the four device regions.

6. The method according to claim 5, further comprising:
forming a spacer oxide layer over the top mandrel;
forming and planarizing a second OPL over the spacer oxide layer;
forming a second ARC over the second OPL;
forming a second PR over the second ARC in a portion of a first device region;
removing the second ARC and second OPL from the second, third, and fourth device regions;
removing the second PR and second ARC from the first device region;
forming a second spacer oxide layer over all four device regions;
etching back the second spacer oxide layer; and
removing the second OPL in the first device region.

7. The method according to claim 6, further comprising:
forming a third OPL and third ARC over the second spacer oxide layer;
forming a third PR in a portion of the second device region and in the third and fourth device regions; and
removing the third ARC and the third OPL in the first region and a portion of the second region; and
removing the third PR and remaining third ARC.

8. The method according to claim 7, further comprising:
removing horizontal portions of the second spacer oxide layer in the first device region; and
removing the top mandrel in the first device region and the third OPL in the second, third and fourth device regions, wherein the third OPL and top mandrel are formed of the same material.

9. The method according to claim 8, further comprising:
forming and planarizing a fourth OPL over the second spacer oxide layer;
forming a fourth ARC over the fourth OPL;
forming a fourth PR in a portion of the fourth device region and in the first and second device regions;
removing the fourth ARC and the fourth OPL in the third device region and a portion of the fourth device region; and
removing remaining fourth PR and fourth ARC.

10. The method according to claim 9, further comprising:
forming a third spacer oxide layer in each of the four device regions;
removing horizontal portions of the third spacer oxide; and
removing remaining fourth OPL in the first, second and fourth regions and removing the top mandrel in the third device region,
wherein the fourth OPL and top mandrel are formed of the same material.

11. The method according to claim 10, further comprising:
performing a spacer oxide etch back to remove the first spacer oxide layer from an upper surface of the top mandrel in the second and fourth device regions;
removing the top mandrel in the second and fourth device regions,
wherein a pitch of remaining first spacer oxide layer is different in each of the four device regions.

12. The method according to claim 11, further comprising:
etching the bottom mandrel down to the bottom spacer formed over the fin channel using the remaining spacer oxide as a mask;
removing the spacer oxide; and
forming a conformal spacer oxide over the bottom mandrel and upper surface of the bottom spacer.

13. The method according to claim 12, further comprising:
removing horizontal portions of the conformal spacer oxide; and
removing the bottom mandrel,
wherein a pitch of remaining conformal spacer oxide layer is different in each of the four device regions.

14. The method according to claim 13, further comprising:

etching the bottom spacer down to a pad oxide layer formed over the fin channel using remaining conformal spacer oxide as a mask.

15. The method according to claim 14, further comprising:
   etching the fin channel through the pad oxide layer to form fins in each of the four device regions, wherein a pitch of the fins in each of the four device regions is different; and
   removing the remaining conformal spacer oxide.

16. The method according to claim 15, comprising:
   etching the fin channel with reactive ion etching (ME); and
   removing the conformal spacer oxide with buffered hydrofluoric acid (BHF).

17. A method comprising:
   forming a pad oxide layer over a silicon germanium (SiGe) fin channel formed in four different device regions, the four different device regions sharing one substrate;
   forming a silicon nitride (SiN) spacer layer over the pad oxide;
   forming bottom mandrel comprising amorphous silicon (a-Si) over the SiN spacer layer;
   forming a top mandrel comprising amorphous carbon (aC) directly on the bottom mandrel;
   forming a buffer oxide layer comprising silicon dioxide over the top mandrel;
   forming an organic planarizing layer (OPL) comprising aC over the buffer oxide layer;
   forming an anti-reflective coating (ARC) over the first OPL;
   forming and patterning a photoresist (PR) layer over the ARC, wherein a pitch of the PR as patterned is different in each of the four device regions;
   etching, at the same time, the ARC, OPL, buffer oxide, and top mandrel using the pattern of the PR in the four different device regions; and
   removing the PR, OPL, and buffer oxide.

* * * * *